(12) United States Patent
Nakao

(10) Patent No.: US 10,581,456 B2
(45) Date of Patent: Mar. 3, 2020

(54) DATA COMPRESSION DEVICE AND DATA DECOMPRESSION DEVICE

(71) Applicant: FUJITSU LIMITED, Kawasaki-shi, Kanagawa (JP)

(72) Inventor: Takanori Nakao, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 319 days.

(21) Appl. No.: 15/608,392

(22) Filed: May 30, 2017

(65) Prior Publication Data

US 2017/0373702 A1    Dec. 28, 2017

(30) Foreign Application Priority Data

Jun. 22, 2016  (JP) .................................. 2016-124006
Feb. 10, 2017  (JP) .................................. 2017-023626

(51) Int. Cl.
*G06F 16/25* (2019.01)
*H03M 7/30* (2006.01)
*G06F 16/23* (2019.01)

(52) U.S. Cl.
CPC ...... *H03M 7/3086* (2013.01); *G06F 16/2365* (2019.01); *G06F 16/258* (2019.01)

(58) Field of Classification Search
CPC . H03M 7/3086; G06F 16/258; G06F 16/2365
USPC ....................................................... 707/693
See application file for complete search history.

(56) References Cited

U.S. PATENT DOCUMENTS

| | | | | |
|---|---|---|---|---|
| 4,494,150 A | * | 1/1985 | Brickman | ............... H03M 7/42 358/1.9 |
| 4,499,499 A | * | 2/1985 | Brickman | ............ H04N 1/4115 358/470 |
| 5,473,326 A | * | 12/1995 | Harrington | ........... G06F 3/0601 341/106 |
| 5,801,648 A | * | 9/1998 | Satoh | ..................... H03M 7/40 341/50 |

(Continued)

FOREIGN PATENT DOCUMENTS

| | | |
|---|---|---|
| JP | 11-65902 | 3/1999 |
| JP | 2012-235289 | 11/2012 |

OTHER PUBLICATIONS

Platoš, Jan, et al., "Word-Based Text Compression", arXiv:0804.3680v1, Cornell University, 2008, 7 pages.*

(Continued)

*Primary Examiner* — Robert Stevens
(74) *Attorney, Agent, or Firm* — Staas & Halsey LLP

(57) ABSTRACT

A data compression device includes a processor configured to extract delimiter characters and character strings from compression target data. The character strings each are sandwiched between two of the delimiter characters in the compression target data. The processor is configured to generate first data by arranging the delimiter characters to allow an order in which the delimiter characters occur in the compression target data to be identified. The processor is configured to generate second data by arranging the character strings for each type of combination of two of the delimiter characters, which sandwich each of the character strings in the compression target data, to allow an order in which the character strings occur in the compression target data to be identified. The processor is configured to perform compression on the first data and the second data. The processor is configured to output a result of the compression.

13 Claims, 22 Drawing Sheets

(56) References Cited

U.S. PATENT DOCUMENTS

| | | | | |
|---|---|---|---|---|
| 6,650,261 | B2* | 11/2003 | Nelson | G06T 9/005 341/106 |
| 7,051,126 | B1* | 5/2006 | Franklin | G06F 13/122 709/247 |
| 7,069,207 | B2* | 6/2006 | Corston-Oliver | G06F 17/271 704/9 |
| 8,120,790 | B2* | 2/2012 | Dawson | G06F 3/1206 358/1.12 |
| 2004/0098671 | A1* | 5/2004 | Graham | G06F 16/40 715/274 |
| 2006/0139188 | A1* | 6/2006 | Sasakura | H03M 7/3084 341/51 |
| 2010/0169441 | A1* | 7/2010 | Lafleur | G06F 17/276 709/206 |
| 2011/0138076 | A1* | 6/2011 | Spicer | H04L 51/066 709/246 |
| 2012/0198419 | A1* | 8/2012 | Neill | G06F 17/276 717/109 |

OTHER PUBLICATIONS

Skibiński, Przemyslaw, et al., "Revisiting dictionary-based compression", Software—Practice and Experience, vol. 35, John Wiley & Sons, Ltd., 2005, pp. 1455-1476.*

Leavline, E. Jebamalar, et al., "Hardware Implementation of LZMA Data Compression Algorithm", ISAIS, vol. 5, No. 4, Mar. 2013, pp. 51-56.*

Ziviani, Nivio, et al., "Compression: A Key for Next-Generation Text Retrieval Systems", Computer, vol. 33, Issue 11, Nov. 2000, pp. 37-44.*

Kernighan, Brian W., et al., The C Programming Language, Prentice-Hall, Inc., Englewood Cliffs, NJ, ©1978, pp. 1, 18-19 and 127.*

Deitel, H. M., et al., C++—How to Program, 2nd Edition, Prentice-Hall, Inc., Upper Saddle River, NJ, © 1998, pp. 237-239 and 822-823.*

Merriam-Webster's Collegiate Dictionary, 10th Edition, Merriam-Webster, Inc., Springfield, MA, © 2000, p. 305.*

* cited by examiner

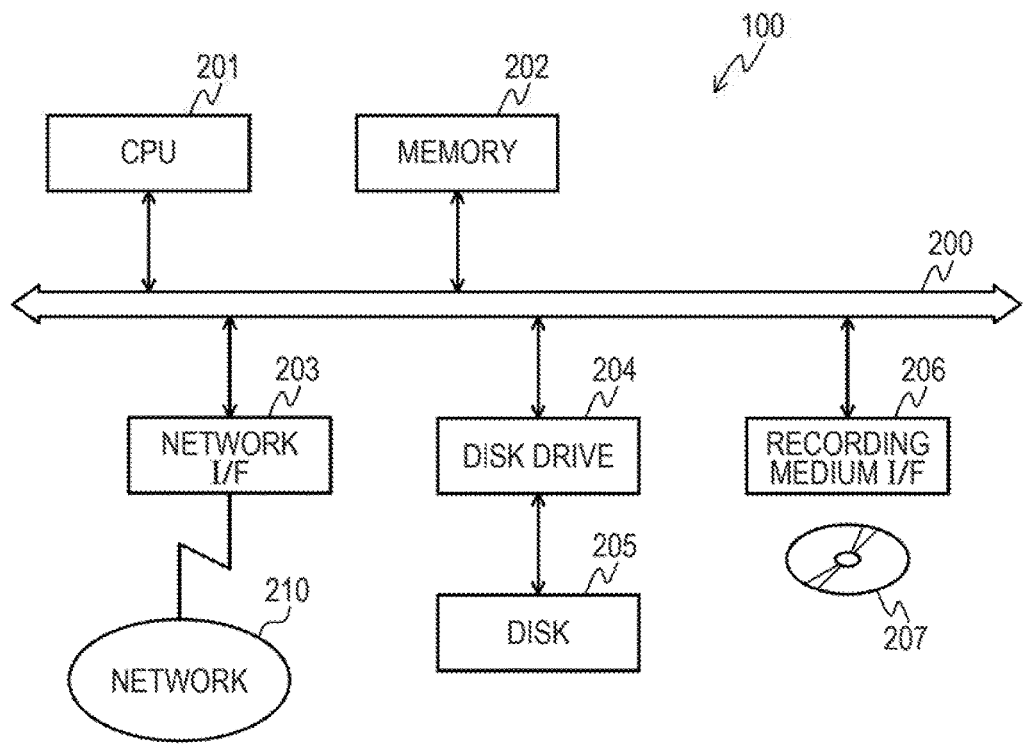
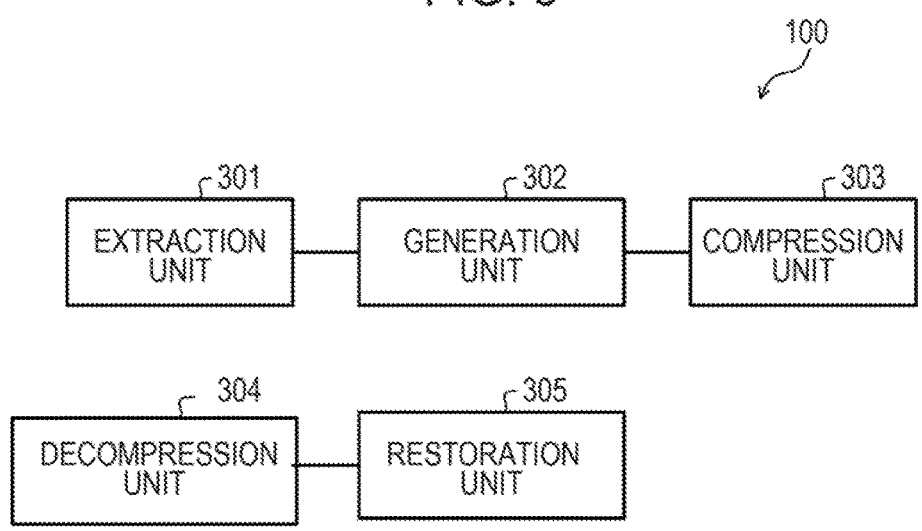

FIG. 10

1000: .11,11,11,...03,03,03..monmap.adding,auth. load,load,load,protocol.isa,none.jerasure, Irc..

500

| pre | post | data |
|---|---|---|
| # | $ | monmap |
| # | , | |
| # | # | adding, auth |
| # | # | load, load, load, protocol |
| # | $ | isa, none |
| # | , | |
| # | # | jerasure, Irc |

| pre | post | data |
|---|---|---|
| $ | $ | 11,11,11 |
| $ | , | |
| $ | # | |
| $ | # | |
| , | $ | 03,03,03 |
| , | , | |
| , | # | |

FIG. 15

1000: .11,11,11,....03,03,03..monmap..adding,auth. load,load,load,protocol..isa,none..jerasure, lrc..

1300:

| pre | post | data |
|---|---|---|
| $ | $ | 11,11,11 |
| $ | , | |
| $ | # | |
| $ | # | |
| , | $ | |
| , | , | 03,03,03 |
| , | # | |
| , | # | |

| pre | post | data |
|---|---|---|
| # | $ | monmap |
| # | , | |
| # | # | adding, auth |
| # | # | load, load, load, protocol |
| # | $ | isa, none |
| # | , | |
| # | # | jerasure, lrc |
| # | # | |

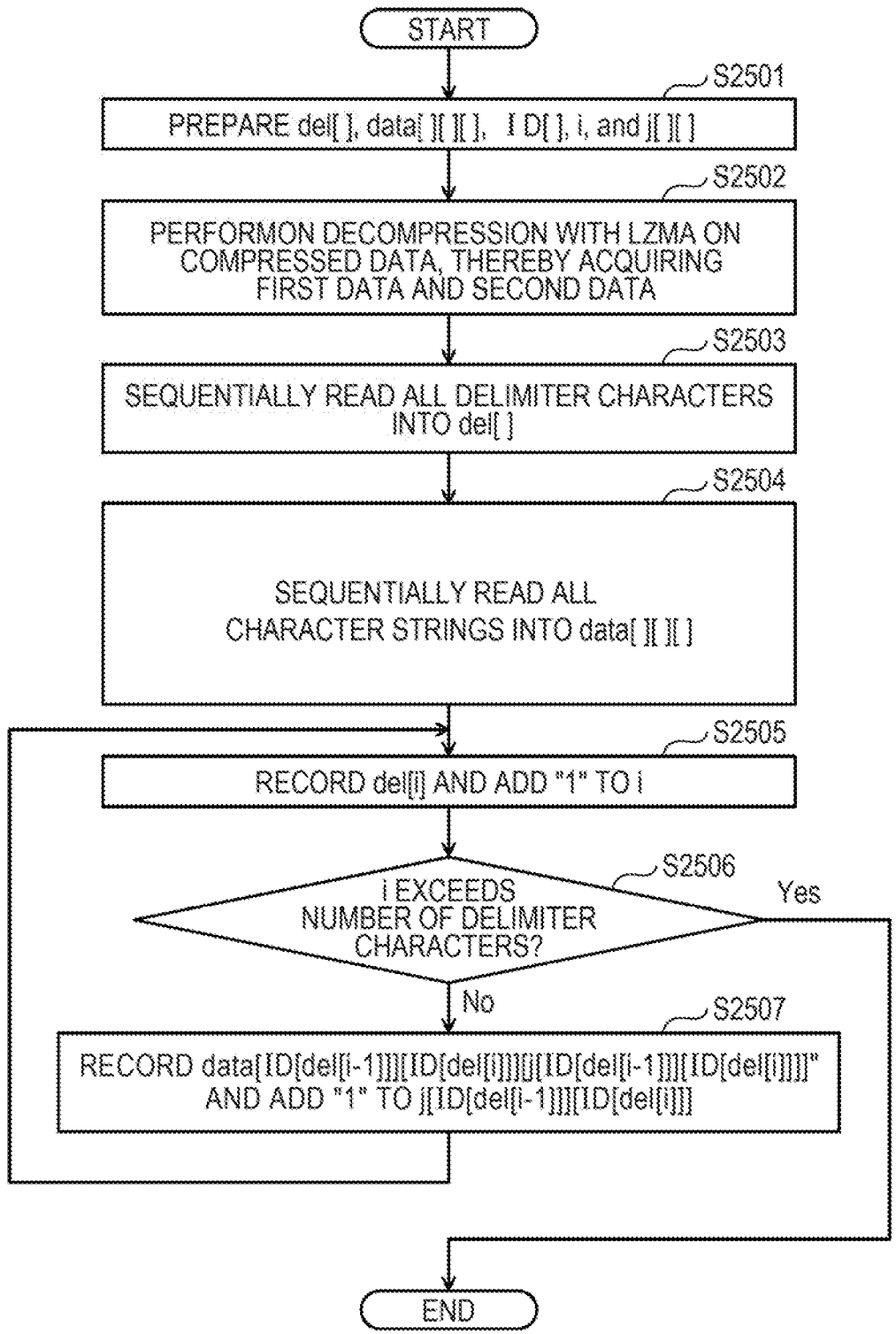

DATA COMPRESSION DEVICE AND DATA DECOMPRESSION DEVICE

CROSS-REFERENCE TO RELATED APPLICATIONS

This application is based upon and claims the benefit of priority of the prior Japanese Patent Application No. 2016-124006, filed on Jun. 22, 2016, and the prior Japanese Patent Application No. 2017-023626, filed on Feb. 10, 2017, the entire contents of which are incorporated herein by reference.

FIELD

The embodiment discussed herein is related to a data compression device and a data decompression device.

BACKGROUND

In the past, there has been a compression technology for compressing data, thereby reducing the size of the data. Examples of the compression technology include a reversible compression (lossless compression) technology capable of decompressing compressed data into data before compression. Examples of the reversible compression technology include compression technologies utilizing a compression algorithm called "Lempel-Ziv 77 (LZ77)" and a compression algorithm called "Lempel-Ziv-Markov chain-Algorithm (LZMA)".

As a related technique, there is a technique that classifies records of an information file into sets each sharing common partitioned data and that sorts pieces of partitioned data, which constitute one record, by the types of partitions, thereby performing compression, for example. In addition, there is a technique that acquires log data, extracts time information, and divides the time information into information with predetermined data widths, thereby generating byte groups, wherein the technique compares values for each of anterior and posterior byte groups and calculates a difference of the values, thereby generating difference value information, and compresses the difference value information, based on the LZ77 method, for example.

Related techniques are disclosed in, for example, Japanese Laid-open Patent Publication No. 11-65902 and Japanese Laid-open Patent Publication No. 2012-235289

However, in the above-mentioned related techniques, a compression efficiency is deteriorated in some cases. For example, compared with a case where the same character string repeatedly occurs at relatively near positions in data (compression target data) to be compressed, when the same character string repeatedly occurs at relatively distant positions, the size of compressed data tends to be increased.

SUMMARY

According to an aspect of the present invention, provided is a data compression device including a memory and a processor coupled to the memory. The processor is configured to extract delimiter characters and character strings from compression target data. The character strings each are sandwiched between two of the delimiter characters in the compression target data. The processor is configured to generate first data by arranging the delimiter characters to allow an order in which the delimiter characters occur in the compression target data to be identified. The processor is configured to generate second data by arranging the character strings for each type of combination of two of the delimiter characters, which sandwich each of the character strings in the compression target data, to allow an order in which the character strings occur in the compression target data to be identified. The processor is configured to perform compression on the first data and the second data. The processor is configured to output a result of the compression.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a diagram illustrating an example of a hardware configuration of an information processing device serving as the data compression device and a data decompression device according to the embodiment;

FIG. 3 is a diagram illustrating an example of a functional configuration of the information processing device;

FIG. 10 is a diagram illustrating the example of generating the intermediate data from the compression target data;

FIG. 15 is a diagram illustrating the example of restoring the compression target data from the intermediate data;

FIG. 25 is a flowchart illustrating an exemplary flow of a modified decompression process.

DESCRIPTION OF EMBODIMENT

Hereinafter, examples of a data compression device and a data decompression device according to an embodiment will be described in detail with reference to the drawings.

Figure 1:
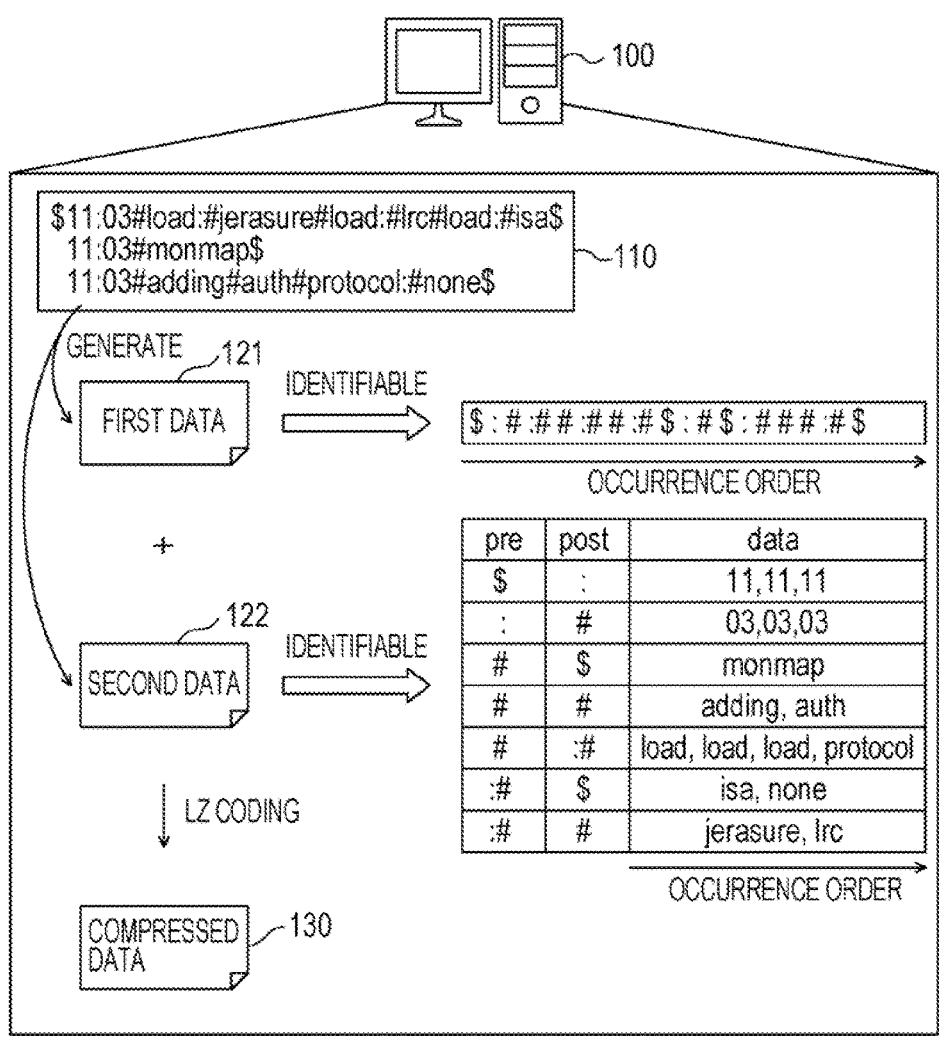
FIG. 1 is a diagram illustrating an example of a compression method performed by a data compression device according to an embodiment.

FIG. 1 is a diagram illustrating an example of a compression method performed by a data compression device according to an embodiment. An information processing device 100 (data compression device and data decompression device) is a computer that performs compression and decompression with a sliding dictionary method. Examples of the compression with the sliding dictionary method include compression based on the "LZ77" and compression based on the "LZMA".

For example, in the compression with the sliding dictionary method, it is conceivable that, in a case where the same character string occurs in compression target data 110 plural times, the character string that occurs later is converted into data indicating a start position and a length of the same character string that previously occurs, thereby compressing the compression target data 110.

However, in this case, a compression efficiency tends to greatly vary depending on a content of the compression target data 110. For example, compared with a case where the same character string repeatedly occurs at relatively near positions in the compression target data 110, when the same character string repeatedly occurs at relatively distant positions, the size of compressed data is unlikely to become small, and the compression efficiency tends to be deteriorated.

Specifically, in the compression with the sliding dictionary method, in a case where a reference range (also called a slide window), which is located anterior to a specific character string, includes a character string that is the same as the specific character string, the specific (posterior) character string that occurs later is converted into data indicating a start position and a length of the same (anterior) character string that previously occurs. At this time, in a case where the posterior character string occurs at a relatively distant position from the anterior character string, the anterior character string does not exist in the reference range located anterior to the posterior character string. Accordingly, it is difficult to convert the posterior character string into data indicating the start position and the length of the anterior character string, in some cases. Therefore, the size of compressed data is unlikely to become small, and the compression efficiency tends to be deteriorated.

In contrast, in a case of widening the reference range, thereby trying to convert the posterior character string into data indicating the start position and the length of the anterior character string that occurs at a relatively distant position, the number of bits used for indicating the start position is caused to be increased. Therefore, even in a case of converting the posterior character string into data indicating the start position and the length of the anterior character string, the size of compressed data is unlikely to become small, and the compression efficiency tends to be deteriorated.

On the other hand, in a case where the posterior character string occurs at a relatively near position from the anterior character string, the anterior character string exists in the reference range located anterior to the posterior character string, and there is a chance that it is possible to convert the posterior character string into data indicating the start position and the length of the anterior character string. Therefore, the compression efficiency is less apt to be deteriorated.

In addition, when the posterior character string occurs at a relatively near position from the anterior character string, even in a case of making the reference range relatively narrow, there is a chance that it is possible to convert the posterior character string into data indicating the start position and the length of the anterior character string. Accordingly, the number of bits used for indicating the start position becomes relatively small. Therefore, even in a case of converting the posterior character string into data indicating the start position and the length of the anterior character string, the compression efficiency is less apt to be deteriorated.

Therefore, in the present embodiment, there will be described a compression method capable of performing compression with the sliding dictionary method after generating, based on the compression target data 110, intermediate data in which the same character string is likely to repeatedly occur at relatively near positions and from which the compression target data 110 may be restored.

Specifically, in a case where the compression target data 110 is a aggregation of data that is delimited by predetermined delimiter characters and that is tailored to a given format, there is a possibility that character strings each sandwiched between two delimiter characters of the same type of combination are the same character strings in the compression target data 110. Therefore, in the present embodiment, by using types of combination of two delimiter characters, intermediate data in which the same character string is likely to repeatedly occur at relatively near positions is generated based on the compression target data 110, thereby achieving an improvement in the compression efficiency.

In the example of FIG. 1, the information processing device 100 receives the compression target data 110. The compression target data 110 is data including predetermined delimiter characters. It is desirable that the compression target data 110 is log data into which logs, delimited by predetermined delimiter characters and tailored to a given format, are aggregated and in which the same character string repeatedly occurs, for example. In the example of FIG. 1, the compression target data 110 is "$11:03#load: #jerasure#load:#lrc#load:#isa$11:03#monmap$11: 03#adding#a uth#protocol:#none$".

The term "delimiter character" means a character used for delimiting, for the sake of convenience, character strings included in the compression target data 110. The delimiter characters are characters other than numeric characters and alphabetical characters, for example. The delimiter characters may be set by an operation input from a user. Each of the delimiter characters is one character, for example. The delimiter characters may include a character string including two or more characters, for example. The delimiter characters may include a control character, for example.

(1-1) The information processing device 100 extracts, from the compression target data 110, predetermined delimiter characters and character strings each sandwiched between two predetermined delimiter characters. It is assumed that the character strings each sandwiched between two predetermined delimiter characters are character strings each including no delimiter character, for example. The information processing device 100 extracts predetermined delimiter characters of "$ : # :# # :# # :# $ : # $ : # # # :# $", for example. The information processing device 100 extracts character strings of "11 11 11 03 03 03 monmap adding auth load protocol isa none jerasure lrc" and so forth, for example.

(1-2) The information processing device 100 generates first data 121 obtained by arranging the extracted delimiter characters so as to allow an order in which the extracted delimiter characters occur in the compression target data 110 to be identified. The information processing device 100 generates, as the first data 121, data obtained by arranging the extracted delimiter characters in an occurrence order, for example. The first data 121 only need to allow an order in which the delimiter characters occur in the compression target data 110 to be identified and may be data obtained by arranging the extracted delimiter characters in an order opposite to an occurrence order. In a case where the number of characters of each of the delimiter characters is not fixed, a predetermined character may be inserted between the delimiter characters so as to allow a boundary between the delimiter characters to be identified.

(1-3) The information processing device 100 generates second data 122 obtained by arranging the extracted character strings for each of the types of combination of two delimiter characters so as to allow an order in which the extracted character strings each sandwiched between two delimiter characters of the relevant type of combination occur in the compression target data 110 to be identified. Combinations are combinations taken in consideration of an order in which delimiter characters are combined. For example, the combinations may include a combination of delimiter characters of ":" and "#" and a combination of delimiter characters of "#" and ":" as different combinations. In addition, the combinations may be combinations taken without consideration of an order in which delimiter characters are combined.

Each of the types is a pattern in which two delimiter characters are combined. Each of the types may be obtained by merging patterns. The information processing device 100 may handle a pattern of the combination of the delimiter characters of ":" and "#" and a pattern of the combination of the delimiter characters of "#" and ":" as the same type of combination, for example.

The information processing device 100 generates, as the second data 122, data in which the extracted character strings are arranged in an occurrence order for each of the types of combination of two delimiter characters, for example. The second data 122 only need to allow an order in which character strings occur in the compression target data 110 to be identified and may be data obtained by arranging the extracted character strings in an order opposite to an occurrence order. The second data 122 may include no information indicating the types of combination of two delimiter characters themselves. By using types of combination of two delimiter characters identifiable from the first data 121, the second data 122 may be able to identify an order in which character strings each sandwiched between two delimiter characters of each of the types of combination occur in the compression target data 110, for example.

(1-4) The information processing device 100 performs, on the generated first data 121 and second data 122, compression with the sliding dictionary method. The information processing device 100 may concatenate the generated second data 122 with the generated first data 121 and perform thereon compression based on the LZMA, for example. The information processing device 100 outputs compressed data 130 obtained by the compression. The information processing device 100 may concatenate the first data 121 and the second data 122 with each other and may perform thereon compression based on the LZMA so that the first data 121 is not converted.

According to this, the information processing device 100 may generate the first data 121 and the second data 122, from which the compression target data 110 may be restored, and may cause the same character string to be likely to repeatedly occur at relatively near positions in the second data 122. Thus, the information processing device 100 is likely to decrease the number of bits for indicating a start position and may cause the same character string to be easily found and to be easily compressed, thereby enabling an improvement in the compression efficiency to be achieved.

Specifically, the information processing device 100 may cause an improvement in the compression efficiency to be easily achieved as for the compression target data 110 in which data delimited by predetermined delimiter characters and tailored to a given format are aggregated. Therefore, in a case of using, as the compression target data 110, table data output by spreadsheet software or log data output by log collection software, the information processing device 100 may further improve the compression efficiency.

Next, an example of a hardware configuration of the information processing device 100 will be described with reference to FIG. 2.

FIG. 2 is a diagram illustrating an example of a hardware configuration of the information processing device 100. In FIG. 2, the information processing device 100 includes a central processing unit (CPU) 201, a memory 202, a network interface (I/F) 203, a disk drive 204, a disk 205, and a recording medium I/F 206. The individual configuration units are coupled to one another via a bus 200.

The CPU 201 manages control of the entire information processing device 100. The memory 202 includes a read-only memory (ROM), a random access memory (RAM), a flash ROM, and so forth, for example. Specifically, the flash ROM and the ROM store therein various kinds of programs, and the RAM is used as a work area of the CPU 201, for example. The various kinds of programs may include a compression program and a decompression program, for example. The programs stored in the memory 202 are loaded into the CPU 201, thereby causing the CPU 201 to perform coded processing.

The network I/F 203 is coupled to a network 210 via a communication line and is coupled to another computer via the network 210. The network I/F 203 manages an interface between the inside of the information processing device 100 and the network 210 and controls input and output of data from and to the other computer. As the network I/F 203, a modem, a local area network (LAN) adapter, or the like may be adopted, for example.

The disk drive 204 controls reading and writing of data from and to the disk 205 under the control of the CPU 201. The disk drive 204 is a magnetic disk drive, for example. The disk 205 is a non-volatile memory to store therein data written under the control of the disk drive 204. The disk 205 is a magnetic disk, an optical disk, or the like, for example.

The recording medium I/F 206 is coupled to an external recording medium 207, manages an interface between the inside of the information processing device 100 and the external recording medium 207, and controls input and output of data from and to the external recording medium 207. The recording medium I/F 206 is a universal serial bus (USB) port, for example. The recording medium 207 is a USB memory, for example. The recording medium 207 may store therein the compression program and the decompression program.

In addition to the above-mentioned configuration units, the information processing device 100 may include a solid state drive (SSD), a semiconductor memory, a keyboard, a mouse, a display, and so forth, for example. In place of the disk drive 204 and the disk 205, the information processing device 100 may include an SSD and a semiconductor memory. Specifically, the information processing device 100 is a mobile phone, a smartphone, a tablet terminal, a personal computer (PC), a server, or the like.

Next, an example of a functional configuration of the information processing device 100 will be described with reference to FIG. 3.

FIG. 3 is a diagram illustrating an example of the functional configuration of the information processing device 100. The information processing device 100 includes an extraction unit 301, a generation unit 302, a compression unit 303, a decompression unit 304, and a restoration unit 305. The extraction unit 301 to the restoration unit 305 are functions to serve as a control unit, and specifically, the functions are realized by causing the CPU 201 to execute programs stored in storage areas such as the memory 202 and the disk 205 illustrated in FIG. 2 or are realized by the network I/F 203. Results of the processing by the respective functional units are stored in storage areas such as the memory 202 and the disk 205, for example.

The extraction unit 301 extracts, from the compression target data 110, predetermined delimiter characters and character strings each sandwiched between two predetermined delimiter characters. The compression target data 110 is data including predetermined delimiter characters. It is desirable that the compression target data 110 is log data into which logs, which are delimited by predetermined delimiter characters and tailored to a given format, are aggregated and in which the same character string repeatedly occurs, for example. The compression target data 110 may be data created by an operation input from the user. The compression target data 110 may be data that is transmitted to the information processing device 100 from another computer and that is requested to be compressed.

The term "delimiter character" means a character used for delimiting, for the sake of convenience, character strings included in the compression target data 110. The delimiter characters are characters other than numeric characters and alphabetical characters, for example. Combinations are combinations taken in consideration of an order in which delimiter characters are combined. The combinations may be combinations taken without consideration of an order in which delimiter characters are combined.

The extraction unit 301 extracts, as delimiter characters, characters other than numeric characters and alphabetical characters from the compression target data 110 and extracts character strings each sandwiched between two characters other than numeric characters and alphabetical characters, for example. Thus, the extraction unit 301 may classify the delimiter characters and character strings other than the delimiter characters.

The extraction unit 301 may use, as one of the delimiter characters, a character string including two or more characters. The extraction unit 301 uses ":#" as one of the delimiter characters, for example. Thus, the extraction unit 301 may cause the number of the types of delimiter characters to be easily increased and to cause the number of the types of combinations of two delimiter characters to be easily increased. Therefore, the extraction unit 301 may cause character strings each sandwiched between two delimiter characters of the same type of combination to become character strings each having the same attribute and to cause the same character strings to be likely to be gathered relatively close to one another in the second data 122, thereby enabling an improvement in the compression efficiency to be achieved.

Under the assumption that each of the delimiter characters includes only one character, the extraction unit 301 may exclude character strings each having two or more characters from the delimiter characters. The extraction unit 301 may exclude ":#" from the delimiter characters and handle ":#" under the assumption that the delimiter characters of ":" and "#" continuously occur, for example. The extraction unit 301 may exclude ":#" from the delimiter characters and handle ":#" under the assumption that the delimiter character of ":" occurs, for example. Thus, the extraction unit 301 may cause the number of the types of delimiter characters to be difficult to be increased and to cause the number of the types of combinations of two delimiter characters to be difficult to be increased. Therefore, the extraction unit 301 may suppress, for each of the types of combination of two delimiter characters, the size of a storage area used when classifying character strings each sandwiched between two delimiter characters of the relevant type of combination and may efficiently perform processing while cutting down the storage area.

The extraction unit 301 may use a control character as one of the delimiter characters. The extraction unit 301 may use, as one of the delimiter characters, a control character indicating a line feed, for example. Thus, when classifying character strings for each of the types of combination of two delimiter characters, the extraction unit 301 may be able to classify character strings each sandwiched between two delimiter characters of a combination including the control character. As a result, the extraction unit 301 may cause the same character strings to be likely to be gathered relatively close to one another in the second data 122, thereby enabling an improvement in the compression efficiency to be achieved.

The extraction unit 301 may receive designation of predetermined delimiter characters and may extract, from the compression target data 110, the designated delimiter characters and character strings each sandwiched between two of the designated delimiter characters. The extraction unit 301 receives, based on an operation input from the user, the designation of predetermined delimiter characters and extracts, from the compression target data 110, the designated delimiter characters and character strings each sandwiched between two of the designated delimiter characters, for example. Thus, the extraction unit 301 becomes able to easily use delimiter characters consistent with the format of the compression target data 110 and may cause the same character strings to be likely to be gathered relatively close to one another in the second data 122, thereby enabling an improvement in the compression efficiency to be achieved.

The extraction unit 301 may handle under the assumption that a control character indicating a line feed occurs at the head of the compression target data 110. Thus, when classifying character strings for each of the types of combination of two delimiter characters, the extraction unit 301 may classify a character string located at the head of the compression target data 110.

The generation unit 302 generates the first data 121 and the second data 122. The first data 121 is data obtained by arranging delimiter characters so as to allow an order in which the delimiter characters occur in the compression target data 110 to be identified. The second data 122 is data obtained by arranging character strings for each of the types of combination of two delimiter characters so as to allow an order in which the character strings each sandwiched between two delimiter characters of the relevant type of combination occur in the compression target data 110 to be identified. Each of the types is a pattern in which two delimiter characters are combined. Each of the types may be obtained by merging patterns. The combination of the delimiter characters of ":" and "#" and the combination of the delimiter characters of "#" and ":" may be handled as the same type of combination, for example.

The generation unit 302 deletes, from the compression target data 110, characters other than the delimiter characters and inserts a predetermined character of "a" between the delimiter characters so as to allow a boundary between the delimiter characters to be identified, thereby transforming the compression target data 110 into the first data 121, for example. That is, the character strings other than the delimiter characters are each replaced with the predetermined character of "a". In a case where the number of characters of each of the delimiter characters is fixed, since a boundary between the delimiter characters does not need to be specified, the generation unit 302 does not need to insert the predetermined character of "a" between the delimiter characters.

The generation unit 302 arranges dots (".") corresponding to the respective types of combination of two delimiter characters, for example. The generation unit 302 inserts, immediately before a dot (".") corresponding to each of the types of combination of two delimiter characters, character strings each sandwiched between the two delimiter characters of the relevant type of combination while delimiting the character strings with a comma (","), thereby generating the second data 122. Thus, the generation unit 302 may generate the first data 121 and the second data 122, from which the compression target data 110 may be restored, and may cause the same character string to be likely to repeatedly occur at relatively near positions in the second data 122.

In a case where the number of the types of delimiter characters that occur in the compression target data 110 is greater than a threshold value, the generation unit 302 may divide the compression target data 110 into pieces of partial data, in each of which the number of the types of delimiter characters to occur becomes less than or equal to the threshold value, in some cases. In this case, the generation unit 302 generates the first data 121 and the second data 122 for each of the pieces of partial data. In this case, the first data 121 is data obtained by arranging delimiter characters so as to allow an order in which the delimiter characters occur in a corresponding one of the pieces of partial data to be identified, for example. In this case, the second data 122 is data obtained by arranging character strings for each of the types of combination of two delimiter characters so as to allow an order in which the character strings each sandwiched between two delimiter characters of the relevant type of combination occur in the corresponding one of the pieces of partial data to be identified, for example. Thus, the generation unit 302 may suppress, for each of the types of combination of two delimiter characters, the size of a storage area used when classifying character strings each sandwiched between two delimiter characters of the relevant type of combination and may efficiently perform processing while cutting down the storage area.

Specifically, the generation unit 302 generates the first data 121 obtained by alternately arranging delimiter characters and predetermined characters in an order in which the delimiter characters occur in the compression target data 110. Specifically, the generation unit 302 generates the second data 122 obtained by alternately arranging, for each of the types of combination of two delimiter characters, character strings each sandwiched between two delimiter characters of the relevant type of combination and predetermined characters in an order in which the character strings occur in the compression target data 110. Thus, the generation unit 302 may generate the first data 121 and the second data 122, from which the compression target data 110 may be restored, and may cause the same character string to be likely to repeatedly occur at relatively near positions in the second data 122.

The compression unit 303 performs, on the generated first data 121 and second data 122, compression with the sliding dictionary method. The compression is compression based on the compression algorithm of the "LZ77", for example. The compression may be compression based on one of various algorithms obtained by improving the compression algorithm of the "LZ77", for example. Specifically, the compression may be compression based on the compression algorithm of the "LZMA" or the like.

The compression unit 303 performs, on the generated first data 121 and second data 122, compression with the compression algorithm of the LZ77 or LZMA, for example. Specifically, the compression unit 303 concatenates the generated first data 121 and second data 122 and performs the compression with the compression algorithm of the LZMA after assigning, to the head of the concatenated data, metadata indicating a boundary between the first data 121 and the second data 122.

The metadata does not need to be subjected to compression. The metadata is a value indicating the position of the head of the second data 122, for example, and is the size of the first data 121, specifically. The metadata may be inserted between the first data 121 and the second data 122. In a case of being inserted between the first data 121 and the second data 122, for example, the metadata is expressed by a character that occurs in none of the first data 121 and the second data 122.

Specifically, after concatenating the first data 121 and the second data 122 and assigning the metadata, the compression unit 303 may compress the second data 122 while compressing none of the metadata and the first data 121. Thus, as for the second data 122 in which the same character string is caused to be likely to repeatedly occur at relatively near positions, the compression unit 303 may achieve an improvement in the compression efficiency in the compression with the sliding dictionary method. The compression unit 303 may use the compression algorithm of the LZ77 or LZMA to be desirably used for compression of the second data 122 and may achieve the reduction of the size of compressed data.

The decompression unit 304 decompresses the compressed data obtained by the compression with the sliding dictionary method on the first data 121 and the second data 122. The decompression unit 304 performs, on the compressed data, decompression with a decompression algorithm corresponding to the compression algorithm of the LZ77 or LZMA. Thus, the decompression unit 304 may obtain the first data 121 and the second data 122, from which the compression target data 110 may be restored.

The restoration unit 305 references the second data 122 obtained by the decompression, thereby sequentially inserting, between two delimiter characters in the first data 121 obtained by the decompression, a character string associated with the type of the combination of the relevant two delimiter characters. Thus, the information processing device 100 may restore the original compression target data 110 from the compressed data which is efficiently compressed.

While, a case where the information processing device 100 has both a function of modified compression (generation of intermediate data from the compression target data 110 and compression of the intermediate data) and a function of modified decompression (decompression of compressed data and restoration of the compression target data 110) is described here, the information processing device 100 is not limited to this. The information processing device 100 may omit one of the function of the modified compression and the function of the modified decompression, for example.

Next, an example of the modified compression of compression target data 400, performed by the information processing device 100, will be described with reference to FIG. 4 to FIG. 11.

Figure 4:
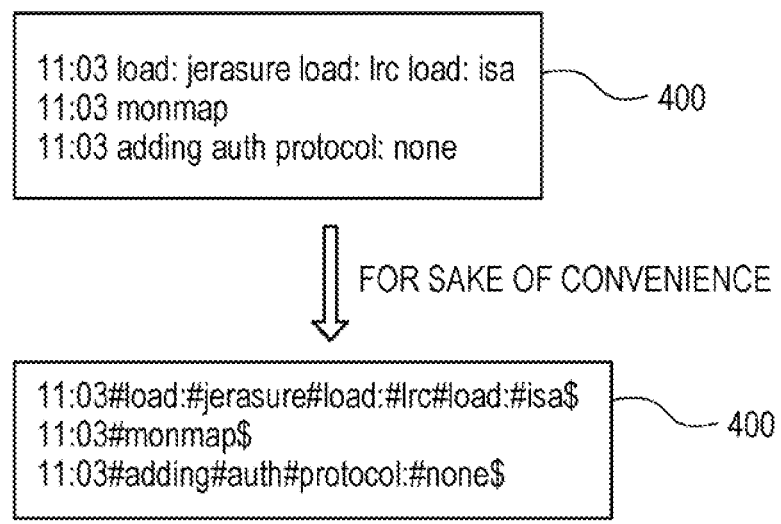
FIG. 4 is a diagram illustrating an example of generating intermediate data from compression target data.

FIG. 4 to FIG. 11 are diagrams illustrating an example of the modified compression of the compression target data 400. In FIG. 4, the information processing device 100 receives input of the compression target data 400. In the example of FIG. 4, the compression target data 400 is data including, as predetermined delimiter characters, characters other than numeric characters and alphabetical characters. The delimiter characters may include a character string including two or more characters. The delimiter characters may include a control character.

Specifically, the first line of the compression target data 400 is "11:03 load: jerasure load: lrc load: isa", and a line feed is inserted at the end thereof. The second line of the compression target data 400 is "11:03 monmap", and a line feed is inserted at the end thereof. The third line of the compression target data 400 is "11:03 adding auth protocol: none", and a line feed is inserted at the end thereof. The control character indicating a line feed is undisplayed.

In the following description, for the sake of convenience, a blank space is represented as "#" and the control character indicating a line feed is represented as "$", in some cases. Therefore, in the following description, the compression target data 400 is "11:03#load:#jerasure#load:#lrc#load:#isa$11:03#monmap$11:03#adding#a uth#protocol:#none$".

Figure 5:
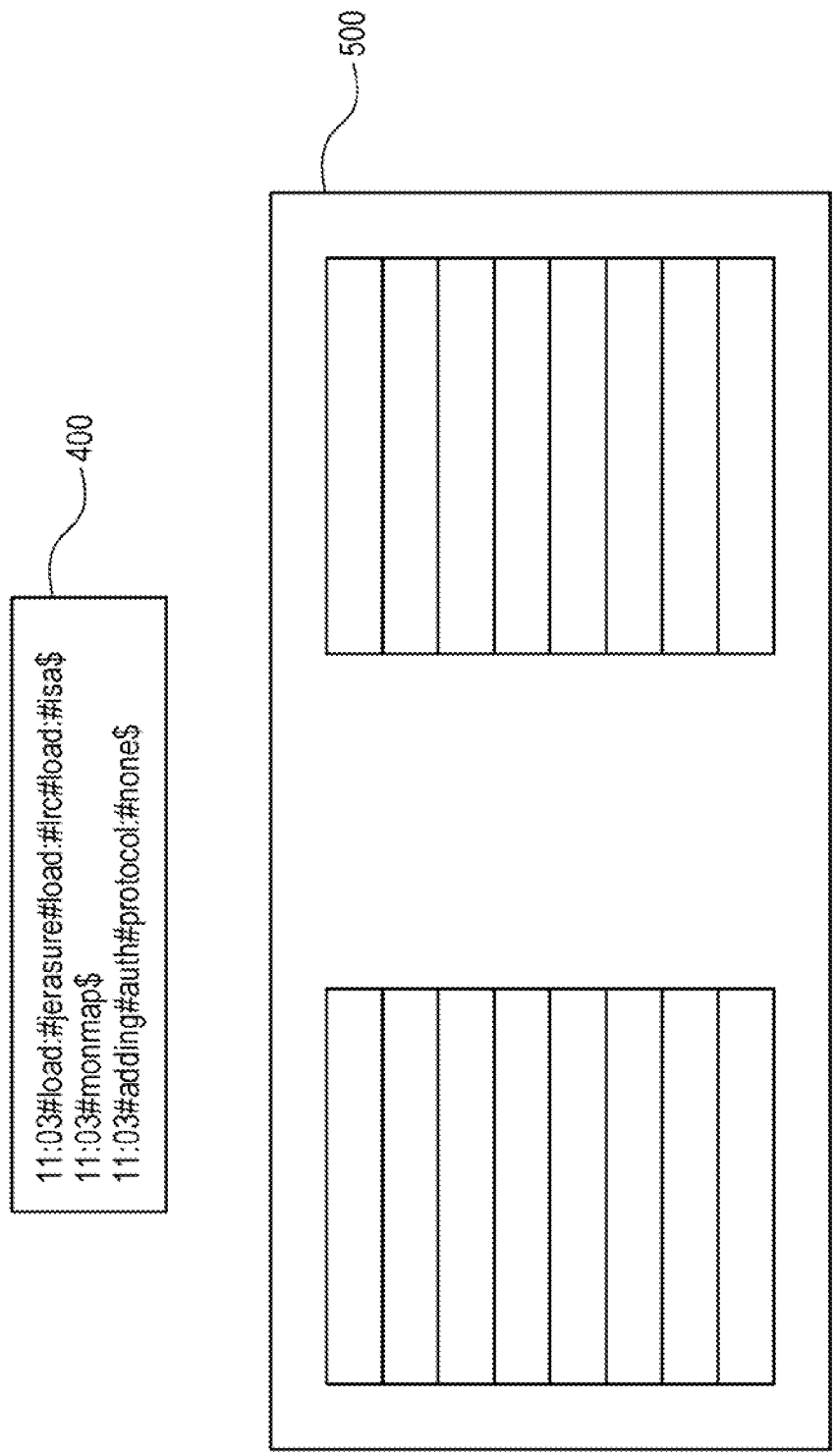
FIG. 5 is a diagram illustrating the example of generating the intermediate data from the compression target data.

In FIG. 5, upon receiving input of the compression target data 400, the information processing device 100 prepares a compression table 500. The compression table 500 is a table used for classifying, for each pattern of a combination of two delimiter characters which occur in the compression target data 400, character strings each sandwiched between the two delimiter characters of the combination of the relevant pattern. For each pattern of a combination of two delimiter characters which occur in the compression target data 400, the compression table 500 includes a storage area corresponding to the combination of the relevant pattern.

Based on the compression target data 400, the information processing device 100 counts the number "4" of the types of delimiter characters, for example, and prepares the compression table 500 including "16" storage areas corresponding to the square of the number "4" of the types of delimiter characters.

Figure 6:
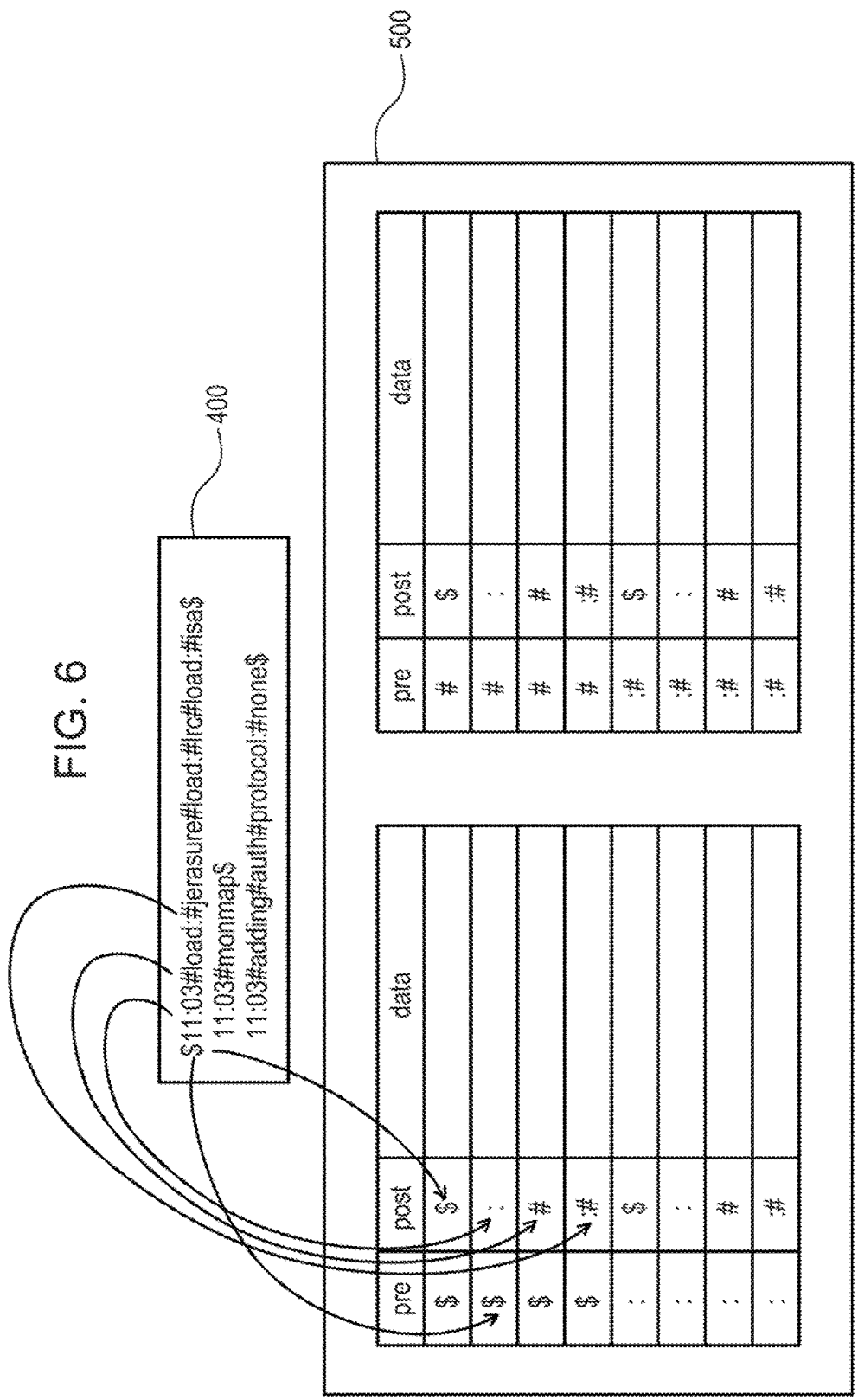
FIG. 6 is a diagram illustrating the example of generating the intermediate data from the compression target data.

In FIG. 6, in a case where the head of the compression target data 400 is not a delimiter character, the information processing device 100 assigns a predetermined delimiter character to the head of the compression target data 400. In the example of FIG. 6, the information processing device 100 assigns the control character of "$" indicating a line feed to the head of the compression target data 400. In addition, in a case where the end of the compression target data 400 is not a delimiter character, the information processing device 100 may assign a predetermined delimiter character to the end of the compression target data 400.

Next, based on the compression target data 400, the information processing device 100 determines patterns of a combination of two delimiter characters in accordance with a predetermined combination rule. The predetermined combination rule is a rule for selecting delimiter characters in order, staring from a delimiter character that occurs earlier, and for combining the respective selected delimiter characters with each of the selected delimiter characters in order, staring from a delimiter character that occurs earlier, for example.

In the example of FIG. 6, the information processing device 100 selects the delimiter character of "$" that occurs first, and determines a pattern obtained by combining, with the selected delimiter character of "$", the delimiter character of "$" that occurs first. In the same way, the information processing device 100 determines respective patterns obtained by combining, with the selected delimiter character of "$", the delimiter character of ":" that occurs second, the delimiter character of "#" that occurs third, and the delimiter character of ":#" that finally occurs. In the same way, the information processing device 100 individually selects the delimiter character of ":" that occurs second, the delimiter character of "#" that occurs third, and the delimiter character of ":#" that finally occurs, and determines patterns of combinations of two delimiter characters.

The information processing device 100 stores, in the individually prepared storage areas, the respective determined patterns of combinations of two delimiter characters and associates the prepared storage areas with the respective determined patterns of combinations of two delimiter characters. In the example of FIG. 6, the information processing device 100 associates one of the prepared storage areas with a pattern of a combination of the delimiter characters of "$" and "$". The information processing device 100 associates one of the prepared storage areas with a pattern of a combination of the delimiter characters of "$" and ":". The information processing device 100 associates one of the prepared storage areas with a pattern of a combination of the delimiter characters of "$" and "#". The information processing device 100 associates one of the prepared storage areas with a pattern of a combination of the delimiter characters of "$" and ":#".

While a case where the information processing device 100 determines, among the patterns of combinations of two delimiter characters, even when a pattern is not used for sandwiching a character string in the compression target data 400 is described here, the information processing device 100 is not limited to this. The information processing device 100 does not need to determine a pattern that is not used for sandwiching a character string in the compression target data 400, for example. In this case, the information processing device 100 does not need to prepare storage areas corresponding to the square of the number of the types of delimiter characters and only needs to prepare storage areas corresponding to patterns used for sandwiching character strings in the compression target data 400.

Figure 7:
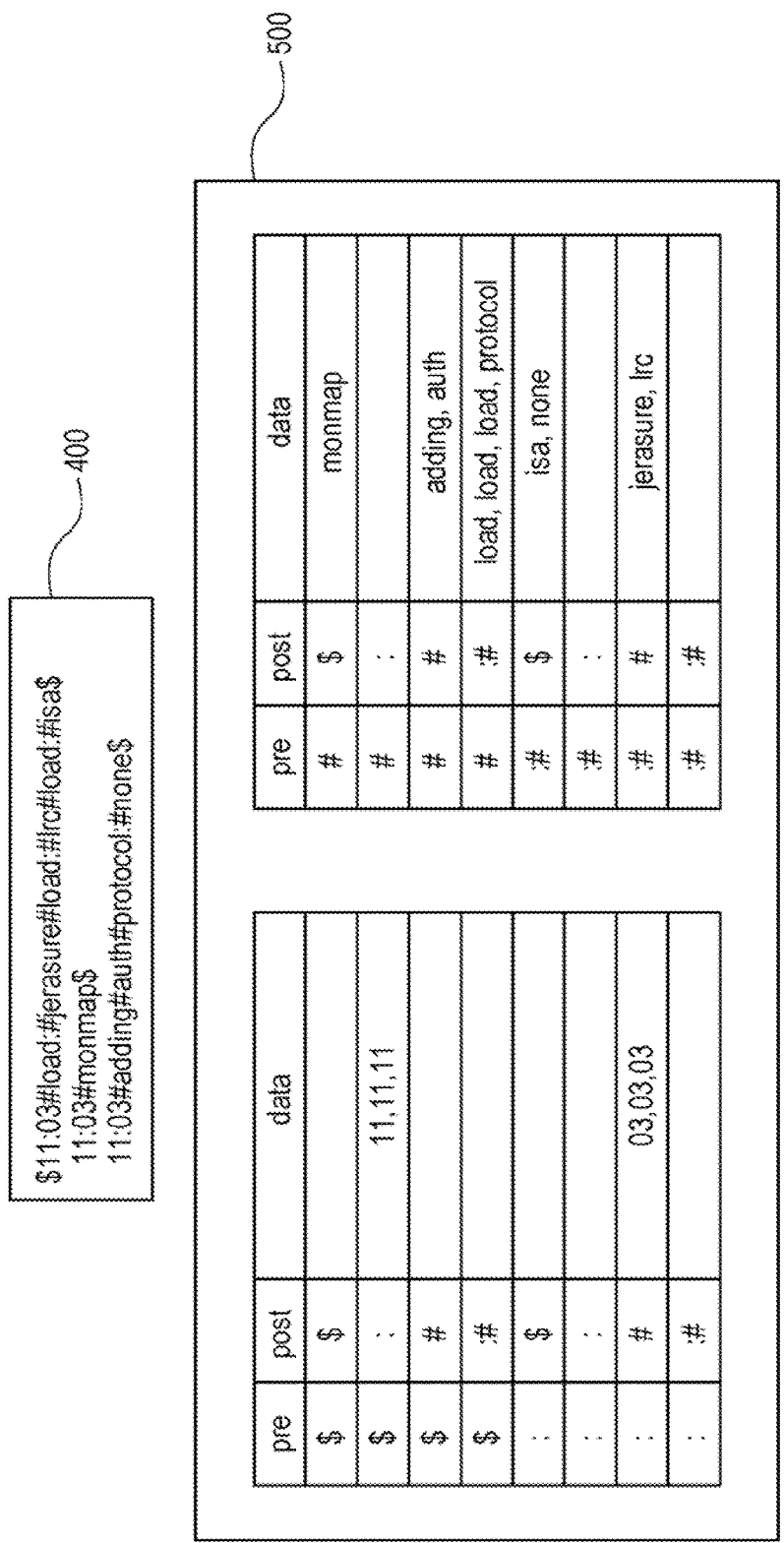
FIG. 7 is a diagram illustrating the example of generating the intermediate data from the compression target data.

In FIG. 7, for each pattern of a combination of two delimiter characters, the information processing device 100 extracts character strings each sandwiched between the two delimiter characters of the combination of the relevant pattern in the compression target data 400. The information processing device 100 stores, in a storage area associated with each pattern of a combination of two delimiter characters, character strings each sandwiched between the relevant two delimiter characters in the compression target data 400 while arranging the character strings so as to allow an order in which the character strings occur in the compression target data 400 to be identified.

The information processing device 100 stores, in a storage area associated with a pattern of a combination of the delimiter characters of "$" and ":", character strings of "11", "11", and "11" each sandwiched between the two delimiter characters of the relevant combination while delimiting the character strings of "11", "11", and "11" with a comma (",") and arranging these in an occurrence order, for example. In the same way, the information processing device 100 stores, in a storage area associated with a pattern of a combination of the delimiter characters of ":" and "#", character strings of "03", "03", and "03" each sandwiched between the two delimiter characters of the relevant combination while delimiting the character strings of "03", "03", and "03" with a comma (",") and arranging these in an occurrence order. In a storage area associated with a pattern of a combination of the delimiter characters of "$" and "$", the information processing device 100 stores no character strings since there is no character string sandwiched between the two delimiter characters of the relevant combination.

Figure 8:
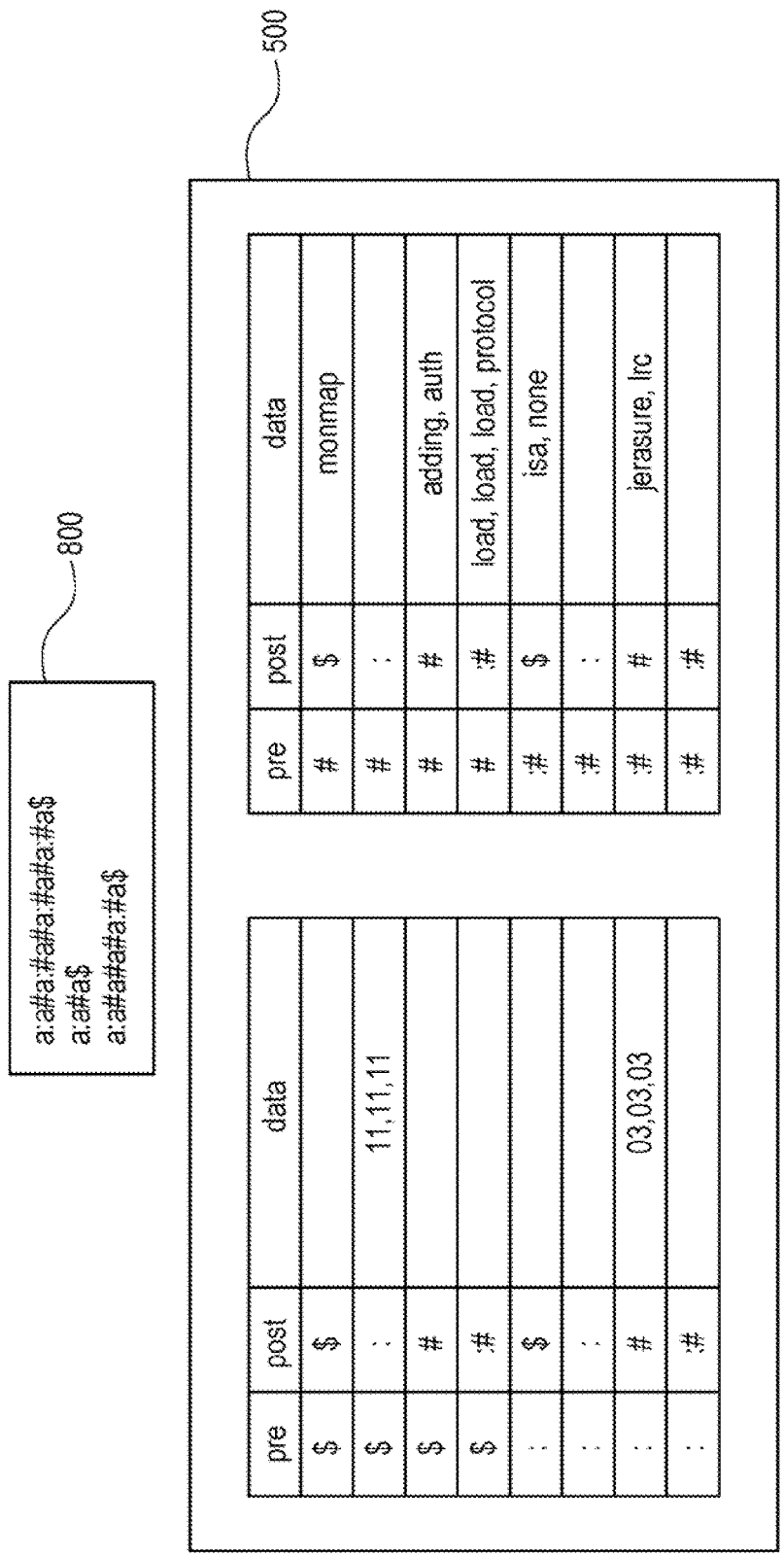
FIG. 8 is a diagram illustrating the example of generating the intermediate data from the compression target data.

In FIG. 8, the information processing device 100 deletes the predetermined delimiter character assigned to the head of the compression target data 400. In an example of FIG. 8, the information processing device 100 deletes the control character indicating a line feed, which is assigned to the head of the compression target data 400. In a case where a predetermined delimiter character is assigned to the end of the compression target data 400, the information processing device 100 deletes the predetermined delimiter character assigned to the end of the compression target data 400.

Then, the information processing device 100 generates first data 800. The first data 800 is data obtained by arranging delimiter characters so as to allow an order in which the delimiter characters occur in the compression target data 400 to be identified. The information processing device 100 deletes, from the compression target data 400, characters other than the delimiter characters and inserts the predetermined character of "a" between the delimiter characters, thereby transforming the compression target data 400 into the first data 800, for example. That is, the character strings other than the delimiter characters are each replaced with the predetermined character of "a".

In the example of FIG. 8, the information processing device 100 deletes, from the compression target data 400, characters other than the delimiter characters, thereby transforming the compression target data 400 into ":#:##:##:#$: #$:###:#$". The information processing device 100 inserts the predetermined character of "a" between the delimiter characters, thereby transforming into the first data 800 of "a:a#a:#a#a:#a#a:#a$a:a#a$a:a#a#a#a:#a$".

While a case where the information processing device 100 deletes the predetermined delimiter character assigned to the head of the compression target data 400 is described here, the information processing device 100 is not limited to this. The information processing device 100 may leave the predetermined delimiter character assigned to the head of the compression target data 400 as it is and may cause the predetermined delimiter character assigned thereto to be deleted at a time of the restoration of the compression target data 400, for example.

Figure 9:
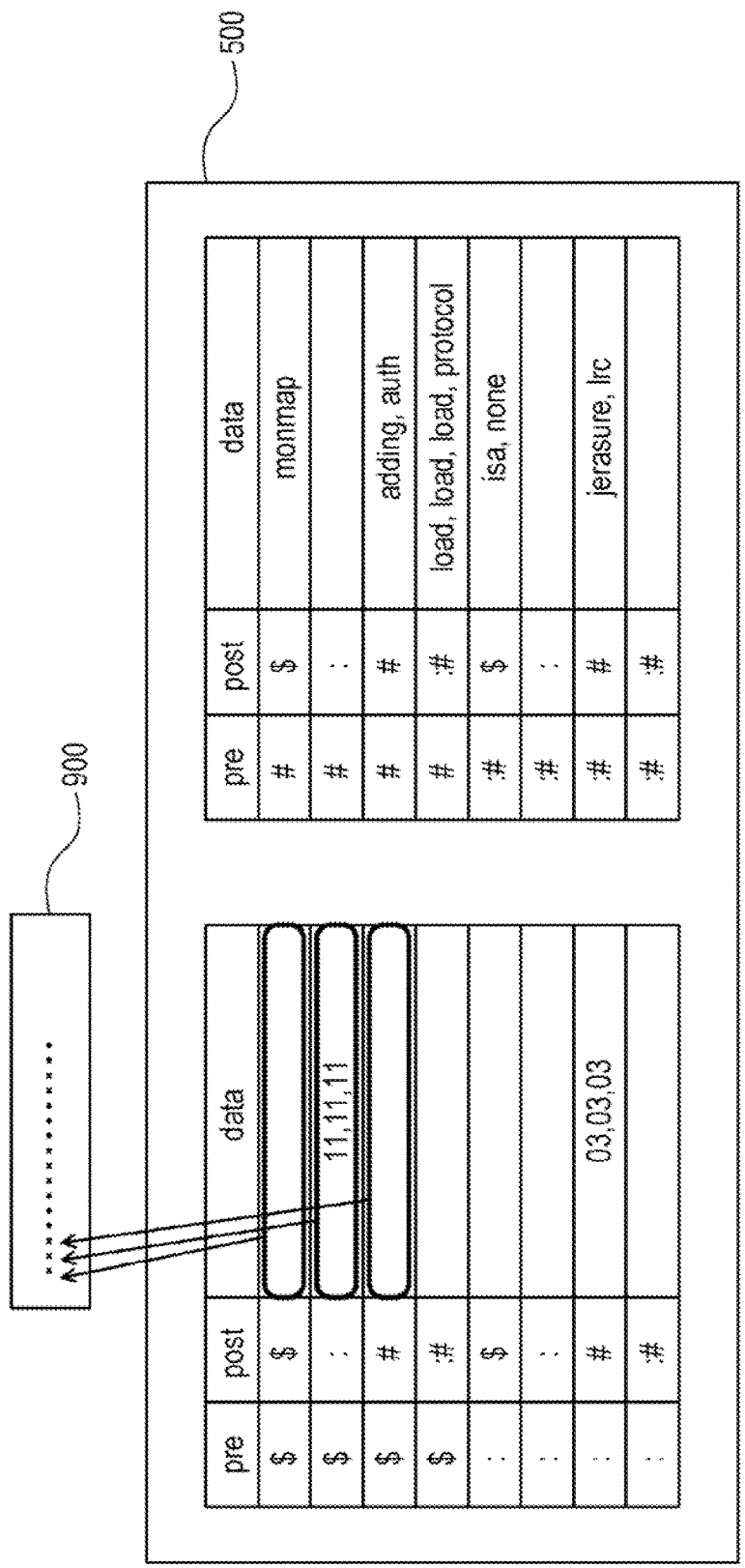
FIG. 9 is a diagram illustrating the example of generating the intermediate data from the compression target data.

In FIG. 9, the information processing device 100 creates data 900 obtained by arranging dots (".") corresponding to the respective patterns of combinations of two delimiter characters. Then, the information processing device 100 inserts, immediately before a dot (".") corresponding to each pattern of a combination of two delimiter characters, character strings each sandwiched between the two delimiter characters of the combination of the relevant pattern while delimiting the character strings with a comma (",").

In the example of FIG. 9, the information processing device 100 creates data of "................" obtained by arranging 16 dots (".") corresponding to respective 16 patterns of combinations of two delimiter characters. Here, starting from a leading dot, dots (".") sequentially correspond to respective patterns of combinations in determining order. In other words, the leading dot (".") corresponds to the pattern of a combination of the delimiter characters "$" and "$" determined first. A second dot (".") corresponds to the pattern of a combination of the delimiter characters "$" and ":" determined second.

The information processing device 100 inserts, immediately before a dot (".") corresponding to the pattern of a combination of the delimiter characters of "$" and ":", character strings of "11", "11", and "11" each sandwiched between the two delimiter characters of the combination of the relevant pattern while delimiting the character strings with a comma (",") and arranging these in an occurrence order. In this way, the information processing device 100 transforms data of "................" obtained by arranging the 16 dots (".") into "0.11,11,11................".

In the same way, the information processing device 100 inserts, immediately before a dot (".") corresponding to a pattern of a combination of the delimiter characters of ":" and "#", character strings of "03", "03", and "03" each sandwiched between the two delimiter characters of the combination of the relevant pattern while delimiting the character strings with a comma (",") and arranging these in an occurrence order. The information processing device 100 inserts no character string immediately before a dot (".") corresponding to a pattern of a combination of the delimiter characters of "$" and "$" since there is no character string sandwiched between the two delimiter characters of the relevant combination.

Thus, as illustrated in FIG. 10, the information processing device 100 obtains second data 1000 by transforming the data 900 by inserting character strings each sandwiched between two delimiter characters of each of patterns while delimiting the character strings with a comma (","). The second data 1000 is data obtained by arranging, for each pattern of a combination of two delimiter characters, character strings each sandwiched between the two delimiter characters of the combination of the relevant pattern so as to allow an order in which the character strings occur in the compression target data 400 to be identified.

In an example of FIG. 10, the second data 1000 is ".11,11,11.....03,03,03..monmap..adding,auth.load,load, load,protocol.isa,none..j erasure,lrc..".

When restoring the compression target data 400, the information processing device 100 may determine, from the first data 800, patterns coincident with an order of combinations of two delimiter characters determined in FIG. 6, by using the predetermined combination rule. Therefore, the second data 1000 only need to allow an order in which character strings each sandwiched between two delimiter characters of each of the types of combination occur in the compression target data 400 to be identified, by using the types of combination of two delimiter characters which may be determined from the first data 800. As a result, the second data 1000 includes no information indicating patterns of combinations of two delimiter characters themselves. The second data 1000 may include information indicating patterns of combinations of two delimiter characters themselves.

Figure 11:
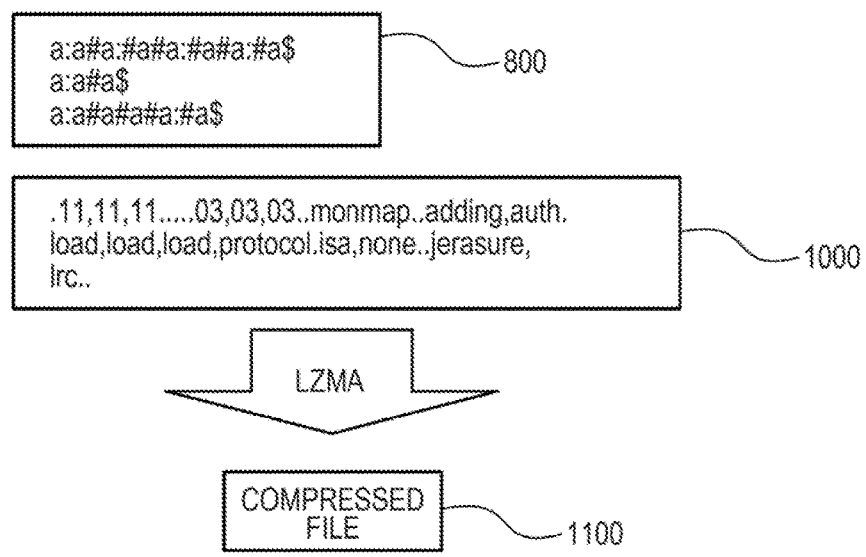
FIG. 11 is a diagram illustrating an example of compressing the intermediate data.

In FIG. 11, the information processing device 100 concatenates the first data 800 and the second data 1000 and performs compression with the compression algorithm of the LZMA, thereby generating a compressed file 1100. To concatenate the second data 1000 with, for example, the end of the first data 800, the information processing device 100 assigns, to the head of the first data 800, metadata indicating a boundary between the first data 800 and the second data 1000. Then, the information processing device 100 performs compression with the compression algorithm of the LZMA on the concatenated first data 800 and second data 1000. The metadata does not need to be compressed.

Next, an example of the modified decompression performed by the information processing device 100, in which the compression target data 400 is restored from the compressed file 1100 generated in FIG. 11, will be described with reference to FIG. 12 to FIG. 23.

Figure 12:
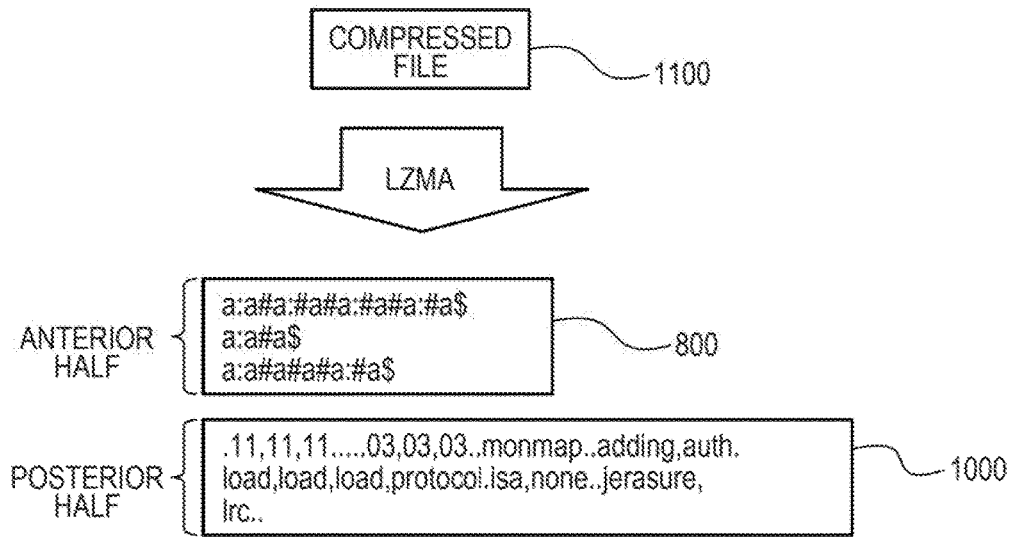
FIG. 12 is a diagram illustrating an example of decompressing compressed data to obtain the intermediate data.

FIG. 12 to FIG. 23 are diagrams illustrating an example of the modified decompression of the compressed file 1100 to restore the compression target data 400. In FIG. 12, the information processing device 100 decompresses the compressed file 1100 by using a decompression algorithm corresponding to the compression algorithm of the LZMA, thereby obtaining the first data 800 and the second data 1000.

By using the decompression algorithm corresponding to the compression algorithm of the LZMA, the information processing device 100 decompresses the compressed file 1100, for example. Based on the metadata located at the head of the first data 800, the information processing device 100 identifies a boundary between the first data 800 and the second data 1000 and obtains the first data 800 and the second data 1000 by division.

Figure 13:
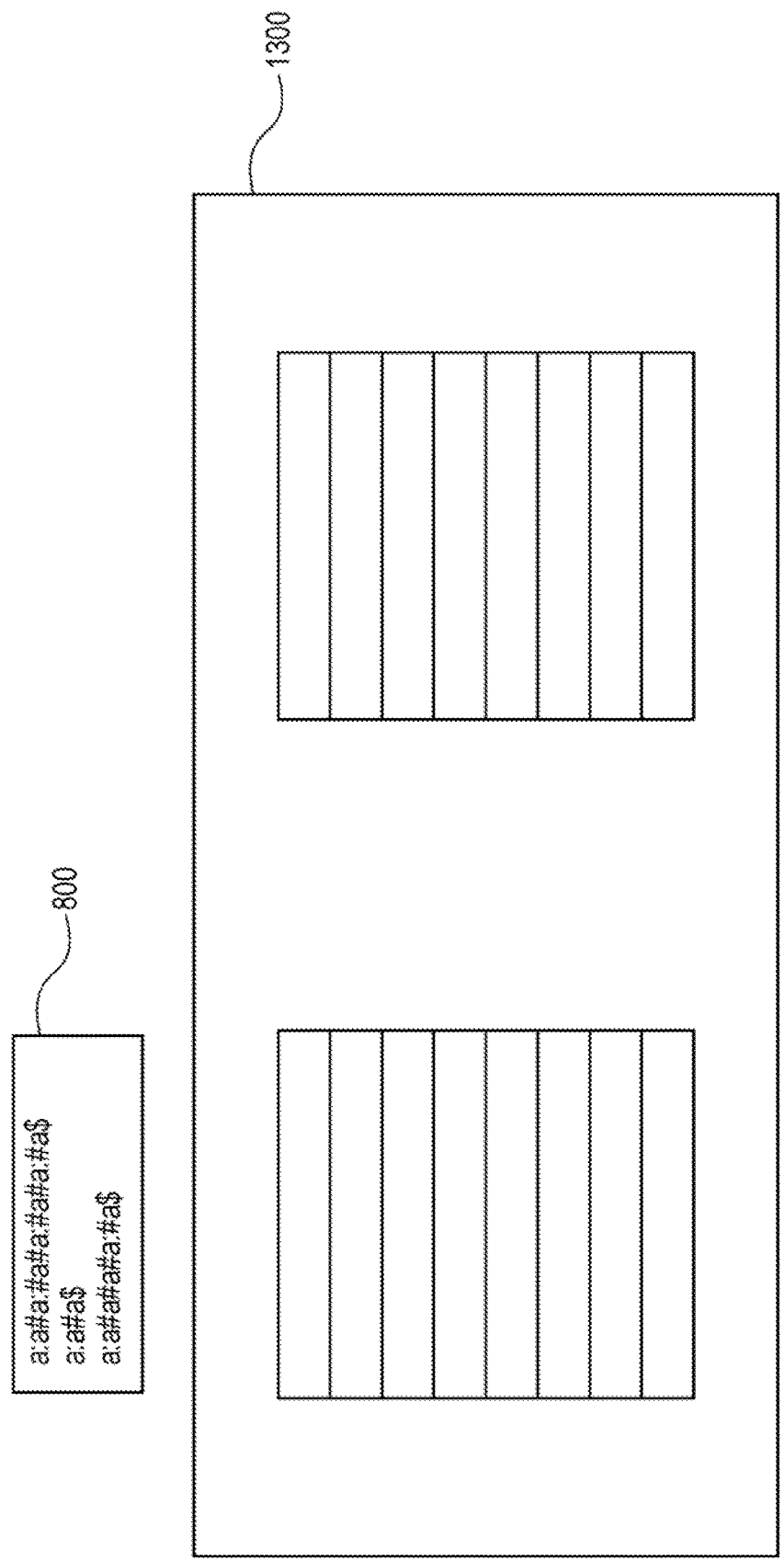
FIG. 13 is a diagram illustrating an example of restoring the compression target data from the intermediate data.

Based on the obtained first data 800, the information processing device 100 prepares a decompression table 1300 as illustrated in FIG. 13. The decompression table 1300 is a table used for classifying, for each pattern of a combination of two delimiter characters which occur in the first data 800, character strings each sandwiched between the two delimiter characters of the combination of the relevant pattern. For each pattern of a combination of two delimiter characters which occur in the first data 800, the decompression table 1300 includes a storage area corresponding to the combination of the relevant pattern. Hereinafter, the decompression table 1300 is created so as to have identical storage contents to those of the compression table 500.

Based on the first data 800, the number, the information processing device 100 counts number "4" of the types of delimiter characters, for example, and prepares the decompression table 1300 including "16" storage areas corresponding to the square of the number "4" of the types of delimiter characters.

Figure 14:
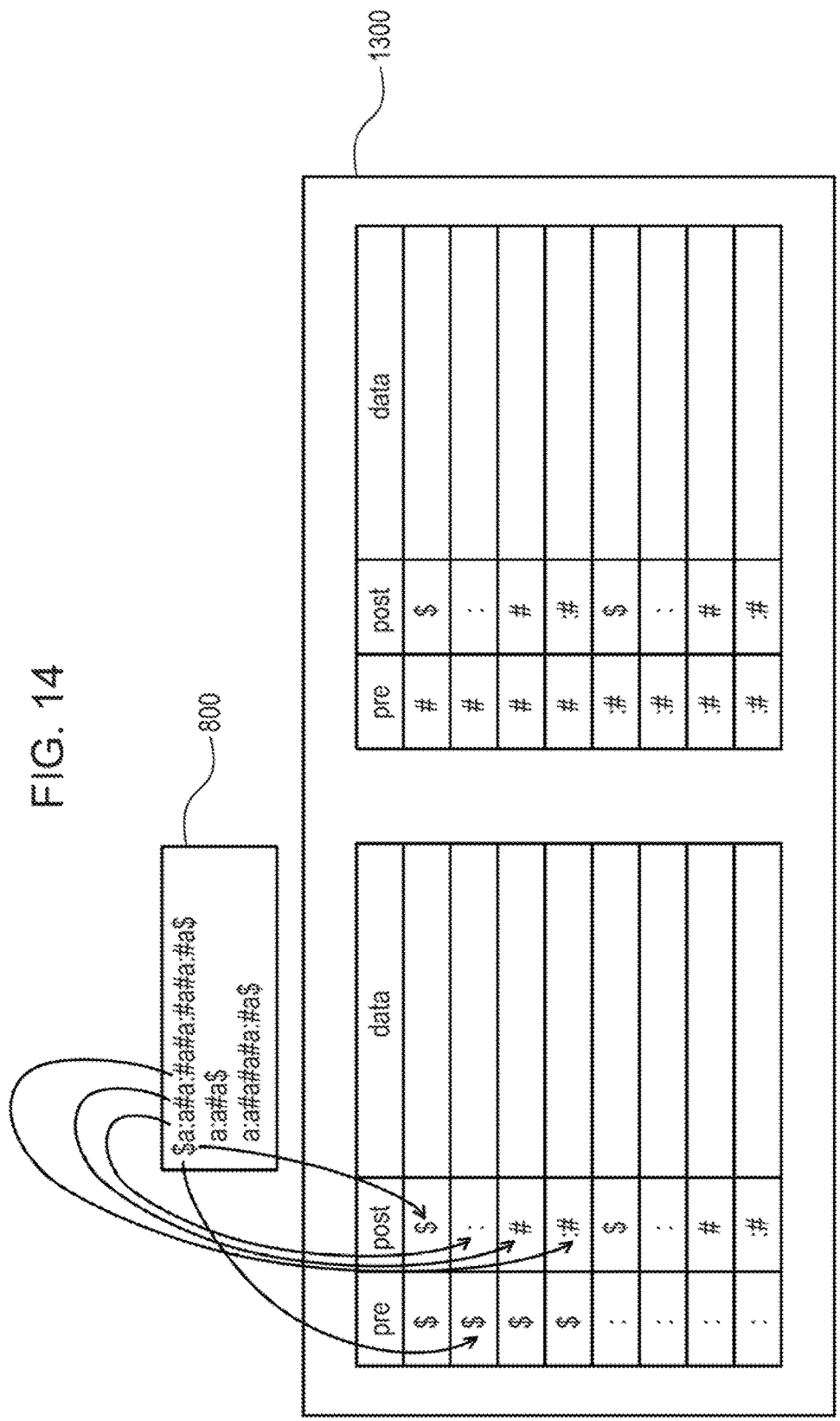
FIG. 14 is a diagram illustrating the example of restoring the compression target data from the intermediate data.

In FIG. 14, in a case where the head of the first data 800 is not a delimiter character, the information processing device 100 assigns a predetermined delimiter character to the head of the first data 800. In the example of FIG. 14, the information processing device 100 assigns the control character of "$" indicating a line feed to the head of the first data 800. In addition, in a case where the end of the first data 800 is not a delimiter character, the information processing device 100 may assign a predetermined delimiter character to the end of the first data 800.

Next, based on the first data 800, the information processing device 100 determines patterns of a combination of two delimiter characters in accordance with a predetermined combination rule. The predetermined combination rule is a rule for selecting delimiter characters in order, staring from a delimiter character that occurs earlier, and for combining the respective selected delimiter characters with each of the selected delimiter characters in order, staring from the delimiter character that occurs earlier, for example. The predetermined combination rule is the same as the combination rule used by the information processing device 100 to determine patterns of combinations of two delimiter characters in FIG. 6.

In the example of FIG. 14, the information processing device 100 selects the delimiter character of "$" that occurs first, and determines a pattern obtained by combining, with the selected delimiter character of "$", the delimiter character of "$" that occurs first. In the same way, the information processing device 100 determines respective patterns obtained by combining, with the selected delimiter character of "$", the delimiter character of ":" that occurs second, the delimiter character of "#" that occurs third, and the delimiter character of ":#" that finally occurs. In the same way, the information processing device 100 individually selects the delimiter character of ":" that occurs second, the delimiter character of "#" that occurs third, and the delimiter character of ":#" that finally occurs, and determines patterns of combinations of two delimiter characters.

The information processing device 100 stores, in the individually prepared storage areas, the respective determined patterns of combinations of two delimiter characters and associates the prepared storage areas with the respective determined patterns of combinations of two delimiter characters. In the example of FIG. 14, the information processing device 100 associates one of the prepared storage areas with a pattern of a combination of the delimiter characters of "$" and "$". The information processing device 100 associates one of the prepared storage areas with a pattern of a combination of the delimiter characters of "$" and ":". The information processing device 100 associates one of the prepared storage areas with a pattern of a combination of the delimiter characters of "$" and "#". The information processing device 100 associates one of the prepared storage areas with a pattern of a combination of the delimiter characters of "$" and ":#".

While a case where the information processing device 100 determines, among the patterns of combinations of two delimiter characters, even when a pattern is not used for sandwiching the predetermined character of "a" in the first data 800 is described here, the information processing device 100 is not limited to this. The information processing device 100 does not need to determine a pattern that is not used for sandwiching the predetermined character of "a" in the first data 800, for example. In this case, the information processing device 100 does not need to prepare storage areas corresponding to the square of the number of the types of delimiter characters and only needs to prepare storage areas corresponding to patterns used for sandwiching the predetermined character of "a" in the first data 800.

In FIG. 15, the information processing device 100 references the second data 1000 and extracts, for each pattern of a combination of two delimiter characters, character strings arranged so as to be associated with the relevant pattern. Then, for each pattern of a combination of two delimiter characters, the information processing device 100 stores, in a storage area associated with the relevant pattern, character strings arranged so as to be associated with the relevant pattern in the second data 1000.

The information processing device 100 stores, for example, in a storage area associated with a pattern of a combination of the delimiter characters of "$" and ":", character strings of "11", "11", and "11" arranged so as to be associated with the relevant pattern in the second data 1000. In the same way, the information processing device 100 stores, in a storage area associated with a pattern of a combination of the delimiter characters of ":" and "#", character strings of "03", "03", "03" arranged so as to be associated with the relevant pattern in the second data 1000. In a storage area associated with a pattern of a combination of the delimiter characters of "$" and "$", the information processing device 100 stores no character strings since there is no character strings arranged so as to be associated with the relevant pattern in the second data 1000.

Figure 16:
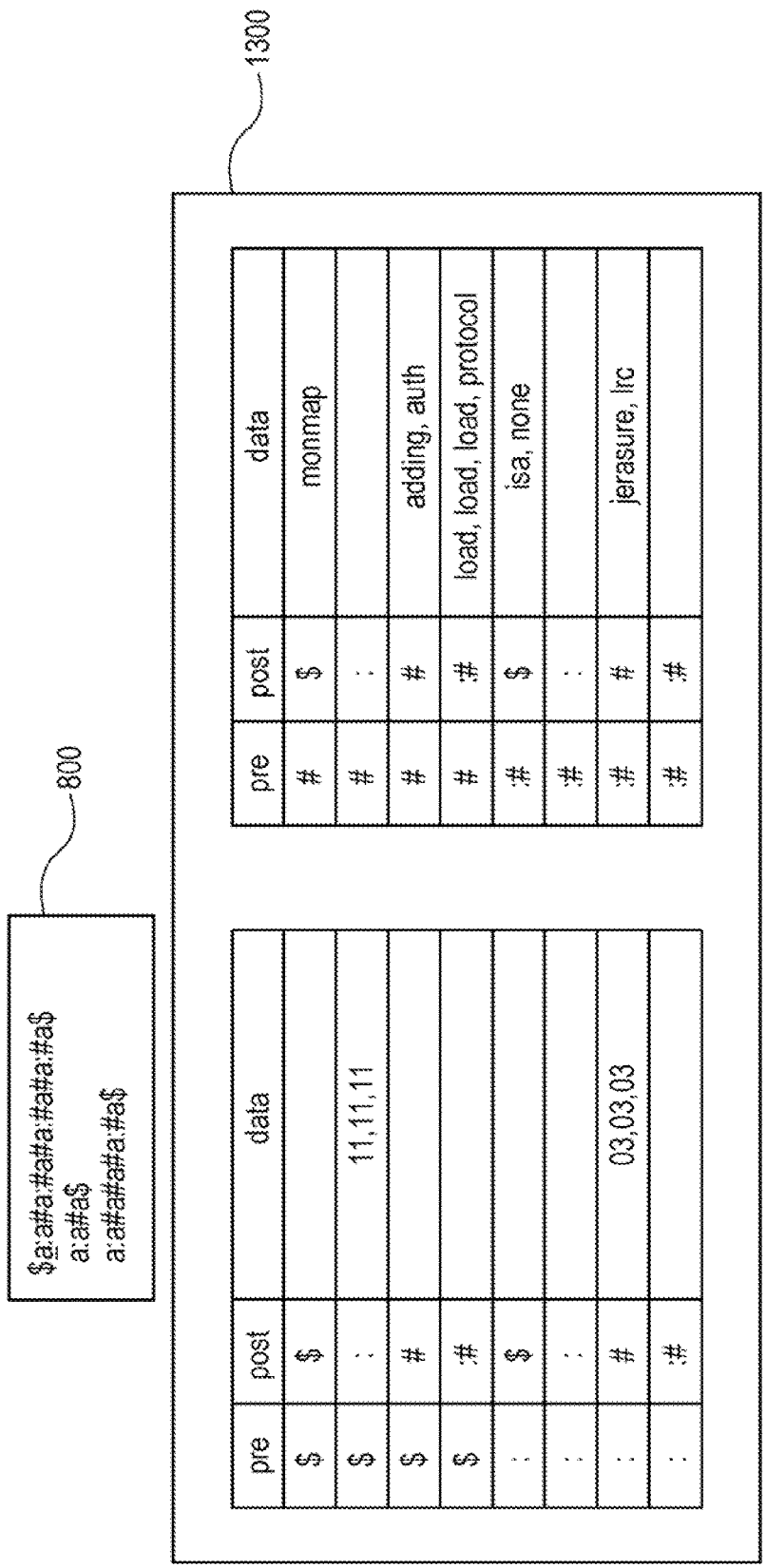
FIG. 16 is a diagram illustrating the example of restoring the compression target data from the intermediate data.

In FIG. 16, the information processing device 100 identifies a point that is sandwiched between two delimiter characters of a combination in the first data 800, at which one of character strings stored in a storage area corresponding to a pattern of the combination of the two delimiter characters is to be inserted.

In the example of FIG. 16, within the first data 800, the information processing device 100 searches for a point at which the predetermined character of "a" exists, for example. Specifically, within the first data 800, the information processing device 100 identifies a point sandwiched between the delimiter characters of "$" and ":", where the character of "a" occurs first.

Figure 17:
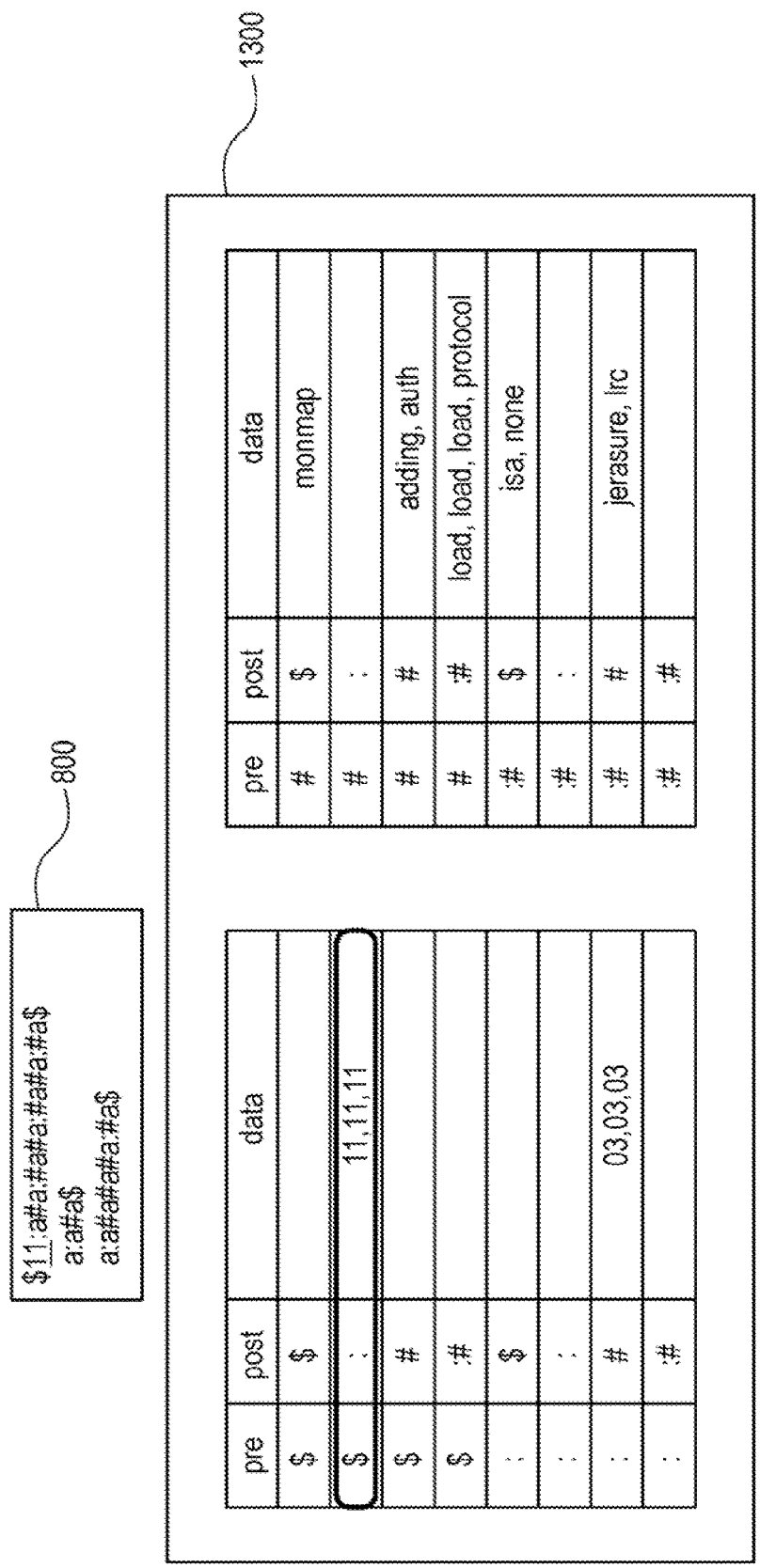
FIG. 17 is a diagram illustrating the example of restoring the compression target data from the intermediate data.

In FIG. 17, the information processing device 100 identifies a pattern of a combination of two delimiter characters that sandwich therebetween the identified point at which the character of "a" exists. Upon identifying a pattern of a combination of the delimiter characters of "$" and ":", the information processing device 100 reads the leading character string of "11" out of the character strings of "11,11,11" stored in a storage area associated with the identified pattern of a combination of the delimiter characters of "$" and ":". Then, the information processing device 100 inserts, into the first data 800, the read character string of "11" in place of the character of "a" that exists at the identified point.

Figure 18:
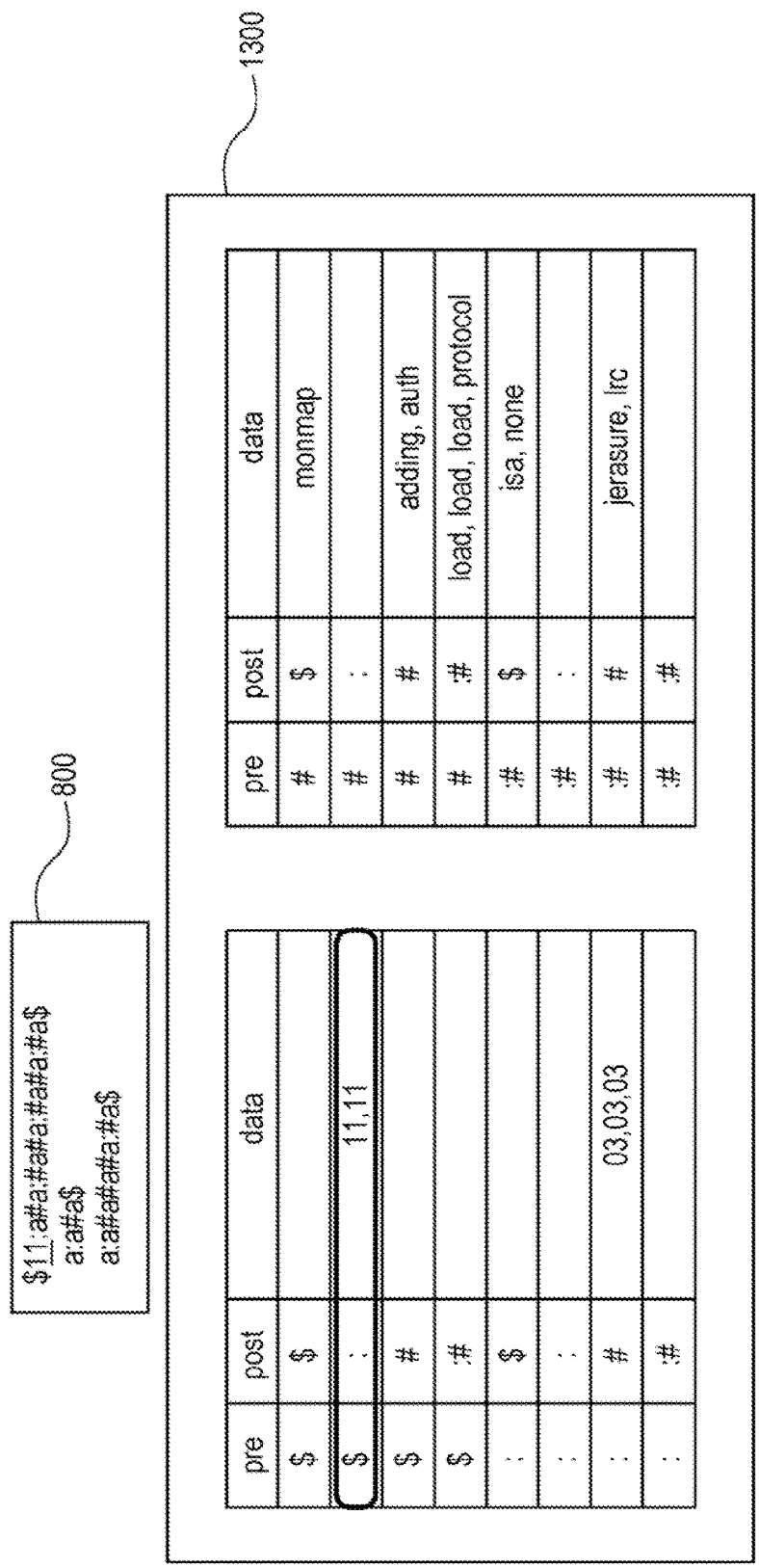
FIG. 18 is a diagram illustrating the example of restoring the compression target data from the intermediate data.

In FIG. 18, the information processing device 100 deletes the already-read leading character string of "11" out of the character strings of "11,11,11" stored in the storage area associated with the identified pattern of a combination of the delimiter characters of "$" and ":".

Figure 19:
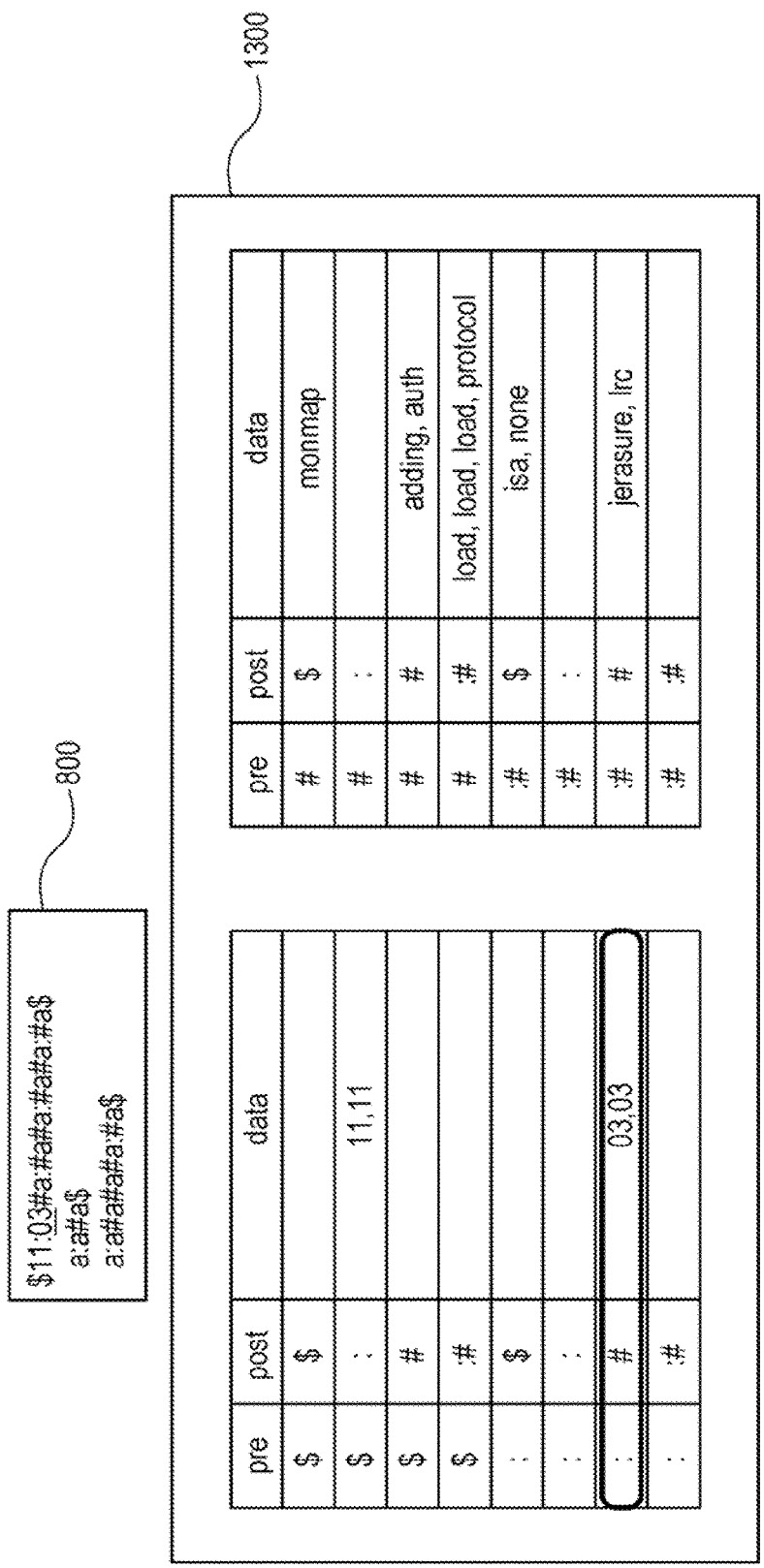
FIG. 19 is a diagram illustrating the example of restoring the compression target data from the intermediate data.

In FIG. 19, in the same way, within the first data 800, the information processing device 100 identifies a point that is sandwiched between the delimiter characters of ":" and "#", where the character of "a" occurs second. The information processing device 100 identifies a pattern of a combination of two delimiter characters that sandwich therebetween the identified point at which the character of "a" exists. Upon identifying a pattern of a combination of the delimiter characters of ":" and "#", the information processing device 100 reads the leading character string of "03" out of the character strings of "03,03,03" stored in a storage area associated with the identified pattern of a combination of the delimiter characters of ":" and "#". Then, the information processing device 100 inserts, into the first data 800, the read character string of "03" in place of the character of "a" that exists at the identified point.

The information processing device 100 deletes the already-read leading character string of "03" out of the character strings of "03,03,03" stored in the storage area associated with the identified pattern of a combination of the delimiter characters of ":" and "#".

Figure 20:
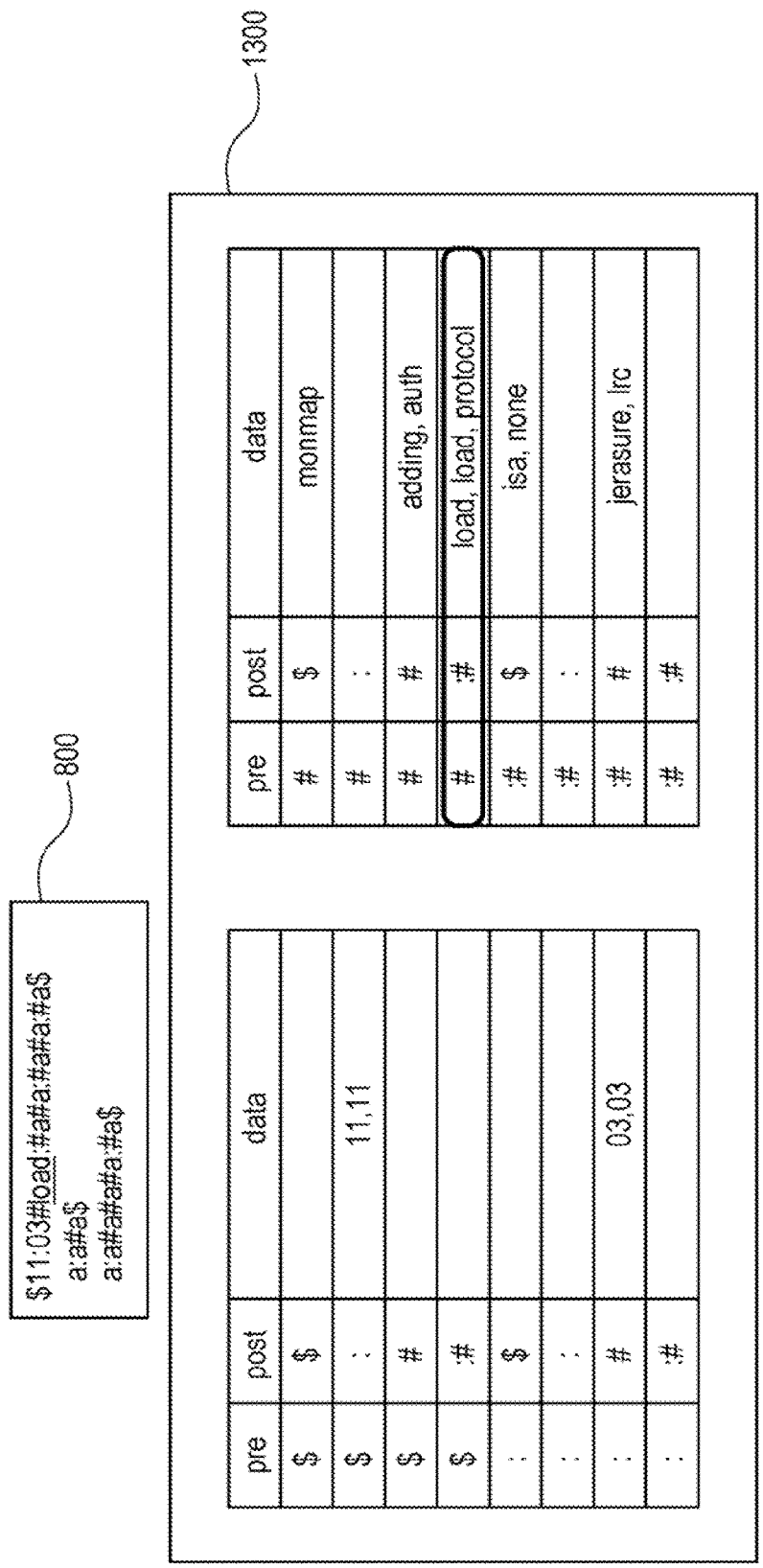
FIG. 20 is a diagram illustrating the example of restoring the compression target data from the intermediate data.

In FIG. 20, in the same way, within the first data 800, the information processing device 100 identifies a point that is sandwiched between the delimiter characters of "#" and ":#", where the character of "a" occurs third. The information processing device 100 identifies a pattern of a combination of two delimiter characters that sandwich therebetween the identified point at which the character of "a" exists. The information processing device 100 reads the leading character string of "load" out of the character strings of "load,load,load,protocol" stored in a storage area associated with the identified pattern of a combination of the delimiter characters of "#" and ":#". Then, the information processing device 100 inserts, into the first data 800, the read character string of "load" in place of the character of "a" that exists at the identified point.

The information processing device 100 deletes the already-read leading character string of "load" out of the character strings of "load,load,load,protocol" stored in the storage area associated with the identified pattern of a combination of the delimiter characters of "#" and ":#".

Figure 21:
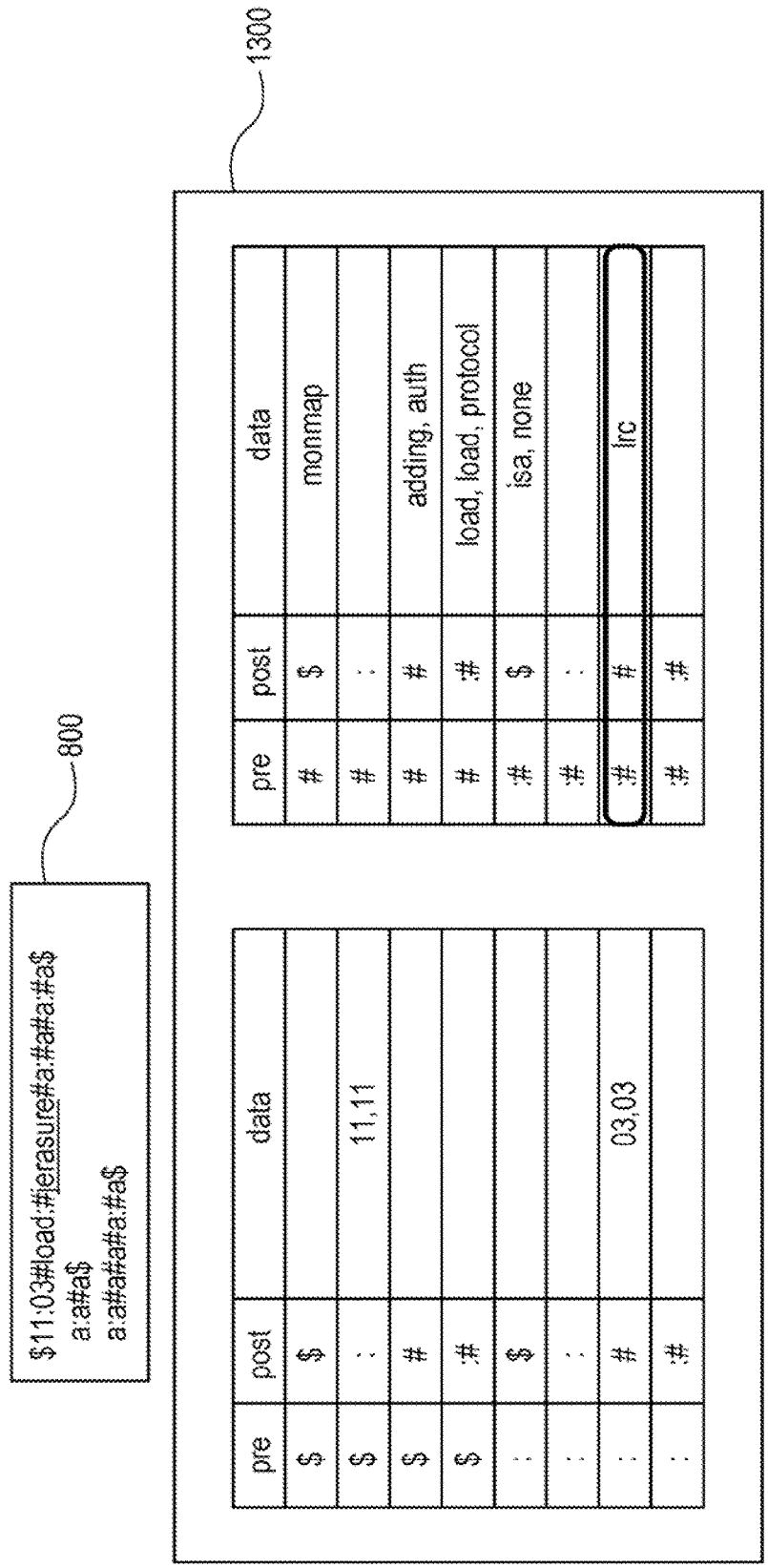
FIG. 21 is a diagram illustrating the example of restoring the compression target data from the intermediate data.

In FIG. 21, in the same way, within the first data 800, the information processing device 100 identifies a point that is sandwiched between the delimiter characters of ":#" and "#", where the character of "a" occurs fourth. The information processing device 100 identifies a pattern of a combination of two delimiter characters that sandwich therebetween the identified point at which the character of "a" exists. The information processing device 100 reads the leading character string of "jerasure" out of the character strings of "jerasure,lrc" stored in a storage area associated with the identified pattern of a combination of the delimiter characters of ":#" and "#". Then, the information processing device 100 inserts, into the first data 800, the read character string of "jerasure" in place of the character of "a" that exists at the identified point.

The information processing device 100 deletes the already-read leading character string of "jerasure" out of the character strings of "jerasure,lrc" stored in the storage area associated with the identified pattern of a combination of the delimiter characters of ":#" and "#".

Figure 22:
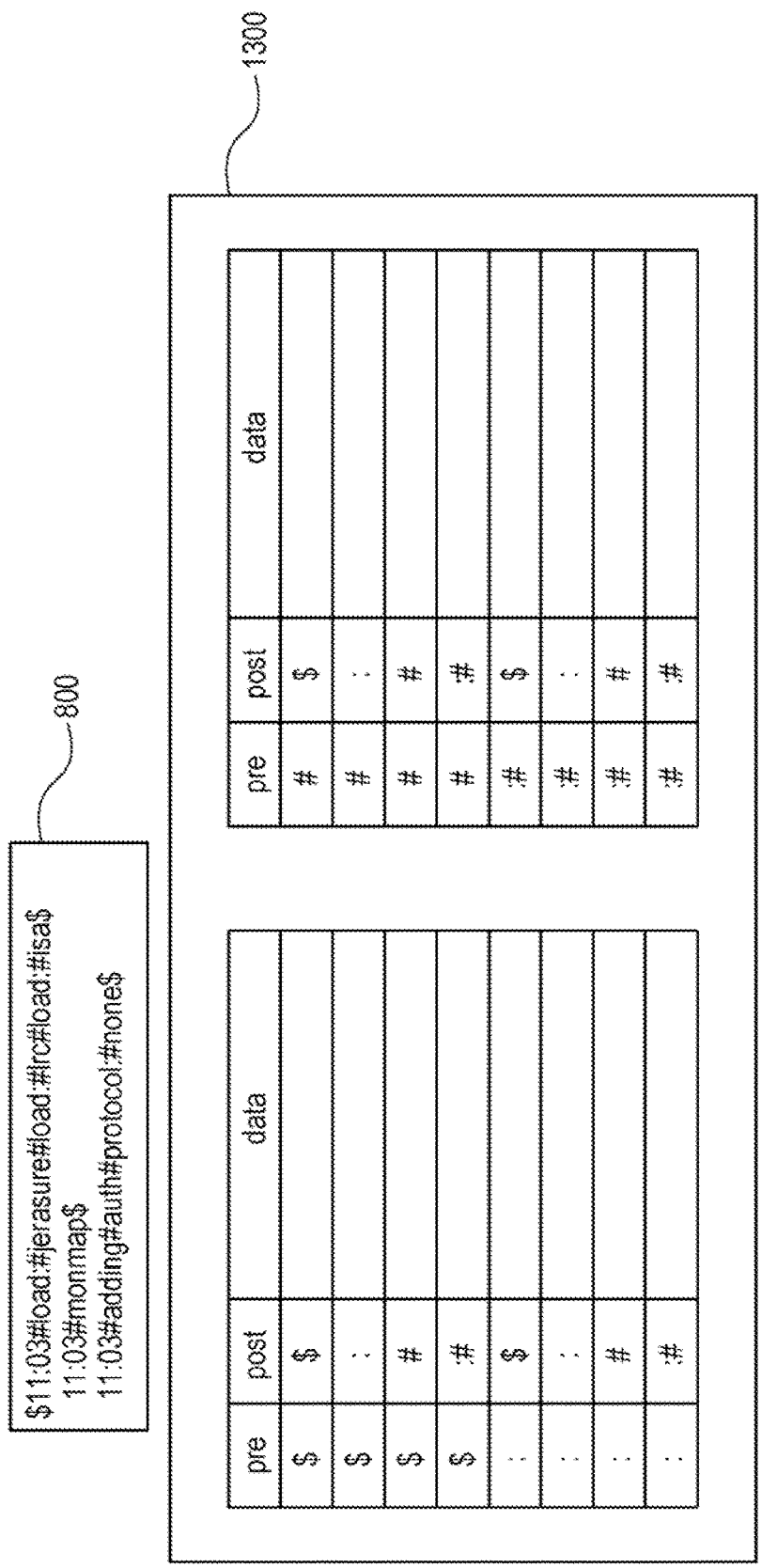
FIG. 22 is a diagram illustrating the example of restoring the compression target data from the intermediate data.

In FIG. 22, in the same way, the information processing device 100 continues replacing the character of "a" in the first data 800. The information processing device 100 transforms the first data 800 into "$11:03#load:#jerasure#load:#lrc#load:#isa$11:03#monmap$11:03#adding#auth#protocol:#none$".

Figure 23:
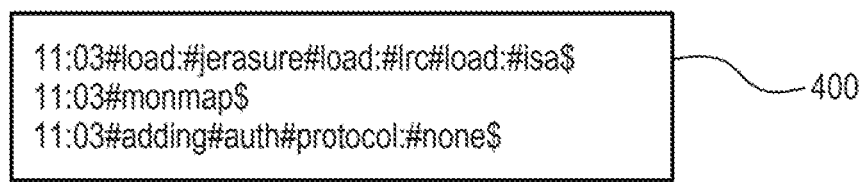
FIG. 23 is a diagram illustrating the example of restoring the compression target data from the intermediate data.

In FIG. 23, the information processing device 100 deletes the control character indicating a line feed, which is assigned to the head of the first data 800, thereby restoring the compression target data 400. Thus, the information processing device 100 may restore the compression target data 400 even from the compressed file 1100 compressed with an improved compression efficiency.

While a case where the information processing device 100 which performs the modified compression on the compression target data 400 and the information processing device 100 which performs the modified decompression to restore the compression target data 400 are the same device is described here, the information processing device 100 is not limited to this. The information processing device 100 (data compression device) which performs the modified compression on the compression target data 400 and the information processing device 100 (data decompression device) which performs the modified decompression to restore the compression target data 400 may be different devices, for example. In this case, when determining patterns of a combination of two delimiter characters, the information processing device 100 (data compression device) which performs the modified compression on the compression target data 400 and the information processing device 100 (data decompression device) which performs the modified decompression to restore the compression target data 400 use the same combination rule.

Next, an exemplary flow of the modified compression process will be described with reference to FIG. 24.

Figure 24:
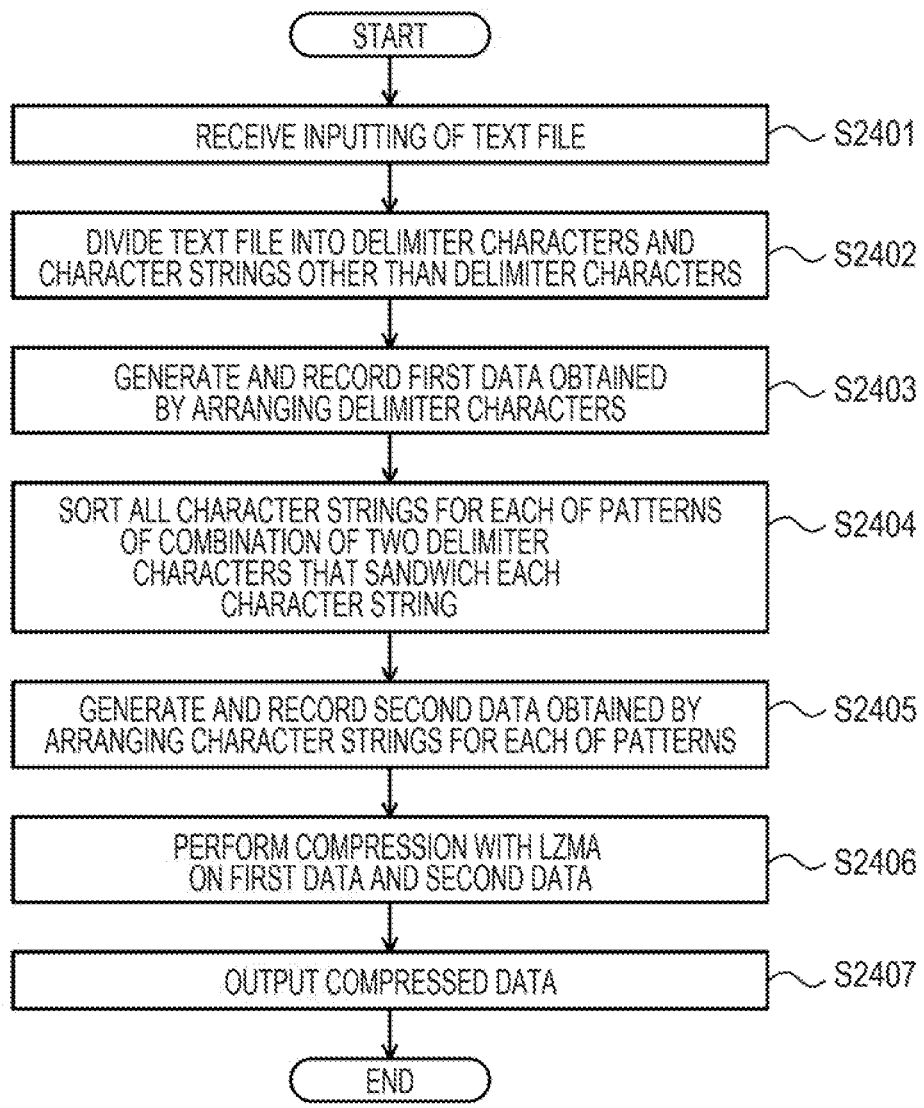
FIG. 24 is a flowchart illustrating an exemplary flow of a modified compression process.

FIG. 24 is a flowchart illustrating an exemplary flow of the modified compression process. In FIG. 24, the information processing device 100 (data compression device) receives input of a text file serving as the compression target data 400 (S2401).

Next, the information processing device 100 divides the text file into delimiter characters and character strings other than the delimiter characters (S2402). The information processing device 100 generates and records first data obtained by arranging all the delimiter characters so as to sandwich predetermined characters between the delimiter characters (S2403).

Next, the information processing device 100 sorts all the character strings for each of patterns of combinations of two delimiter characters that sandwich each character string (S2404). The information processing device 100 generates and records second data obtained by arranging, for each of the patterns of combinations of two delimiter characters, all the sorted character strings so as to allow an order in which the respective character strings occur in the text file to be identified (S2405).

Next, the information processing device 100 performs compression with the LZMA, on the recorded delimiter characters (the first data) and the recorded character strings (the second data) (S2406). Then, the information processing device 100 outputs compressed data obtained by the compression (S2407) and terminates the modified compression process. Thus, the information processing device 100 may compress the compression target data 400 so as to be able to restore the compression target data 400.

Next, an exemplary flow of the modified decompression process will be described with reference to FIG. 25.

FIG. 25 is a flowchart illustrating an exemplary flow of the modified decompression process. In FIG. 25, the information processing device 100 (data decompression device) prepares a character string array of "del[ ]", a character string array of "data[ ][ ][ ]", an integer array of "ID[ ]", an integer of "i", and an integer array of "j[ ][ ]" (S2501).

The character string array of "del[ ]" is an array in which read delimiter characters are stored in order. The index of the character string array of "del[ ]" is a serial number assigned to a corresponding one of the read delimiter characters and is a number indicating where the relevant delimiter character exists in an order from the head of decompressed data. A delimiter character that exists first from the head of the decompressed data is stored in "del[1]", for example.

The character string array of "data[ ][ ][ ]" is an array in which read character strings are stored in order. The first index of the character string array of "data[ ][ ][ ]" is a number assigned to the type of a delimiter character that occurs immediately before a corresponding one of the read character strings. The second index of the character string array of "data[ ][ ][ ]" is a number assigned to the type of a delimiter character that occurs immediately after the corresponding one of the read character strings.

The third index of the character string array of "data[ ][ ][ ]" is a serial number sequentially assigned to a character string sandwiched between a combination of delimiter characters of the types corresponding to the first and second indexes, respectively. In a case where a number assigned to the type of the delimiter character of "$" is "1", a character string that exists first from the head of the decompressed data, among the character strings sandwiched between a combination of the two delimiter characters of "$" is stored in "data[1][1][1]", for example.

The integer array of "ID[ ]" is an array in which numbers assigned to the respective types of delimiter characters are stored. The index of the integer array "ID[ ]" is a serial number assigned to a corresponding one of the delimiter characters and is a number indicating where the relevant delimiter character exists in an order from the head of decompressed data. A number assigned to the type of a delimiter character that exists first from the head of the decompressed data is stored in "ID[1]", for example.

The integer of "i" is a number for specifying where a delimiter character exists in an order from the head of decompressed data. An initial value of the integer of "i" is "1".

The integer array of "j[ ]" is an array in which a number for specifying, for each of combinations of delimiter characters, where a corresponding one of character strings exists in an order from an earlier one among the character strings each sandwiched between the relevant combination is stored. The first index of the integer array of "j[ ][ ]" is a number assigned to the type of a delimiter character located on a front side of a combination of delimiter characters. The second index of the integer array of "j[ ][ ]" is a number assigned to the type of a delimiter character located on a rear side of the combination of delimiter characters.

An initial value of each of "j[ ]" is "1". In a case where a number assigned to the type of the delimiter character of "$" is "1", a number for specifying where a corresponding one of character strings exists in an order from an earlier one among the character strings each sandwiched between the combination of the two delimiter character of "$" is stored in "j[1][1]", for example.

The information processing device 100 performs, on the compressed data, decompression with the LZMA, thereby obtaining decompressed data (the first data and the second data) in which all the delimiter characters and all the character strings are arranged (S2502). Then, the information processing device 100 sequentially reads all the delimiter characters into "del[ ]" (S2503).

The information processing device 100 sequentially reads all the character strings into "data[ ][ ][ ]" for each pattern of a combination of two delimiter characters that sandwich the relevant character strings (S2504). Then, the information processing device 100 records "del[i]" and adds "1" to "i" (S2505).

Next, the information processing device 100 determines whether or not "i" exceeds the number of the delimiter characters (S2506). In a case of exceeding the number of the delimiter characters (S2506: Yes), the information processing device 100 terminates the modified decompression process.

On the other hand, in a case of not exceeding the number of the delimiter characters (S2506: No), the information processing device 100 records "data[ID[del[i-1]]][ID[del[i]]][j[ID[del[i-1]]][ID[del[i]]]]" and adds "1" to "j[ID[del[i-1]]][ID[del[i]]]" (S2507). Then, the process returns to S2505. Thus, the information processing device 100 may restore the compression target data 400.

As described above, according to the information processing device 100, it is possible to extract, from the compression target data 400, predetermined delimiter characters and character strings each sandwiched between two predetermined delimiter characters. According to the information processing device 100, it is possible to generate the first data 800 obtained by arranging the delimiter characters so as to allow an order in which the delimiter characters occur in the compression target data 400 to be identified. According to the information processing device 100, it is possible to generate the second data 1000 obtained by arranging character strings for each of the types of combination of two delimiter characters so as to allow an order in which the character strings each sandwiched between two delimiter characters of the relevant type of combination occur in the compression target data 400 to be identified. According to the information processing device 100, it is possible to perform compression with the sliding dictionary method on the generated first data 800 and second data 1000. Thus, the information processing device 100 may generate the first data 800 and the second data 1000, from which the compression target data 400 may be restored, and may cause the same character string to be likely to repeatedly occur at relatively near positions in the second data 1000. As a result, the information processing device 100 is likely to decrease the number of bits for indicating start positions and may cause the same character string to be easily found and to be easily compressed, thereby achieving an improvement in the compression efficiency.

According to the information processing device 100, it is possible to receive designation of predetermined delimiter characters. According to the information processing device 100, it is possible to extract, from the compression target data 400, the designated delimiter characters and character strings each sandwiched between two of the designated delimiter characters. Thus, the information processing device 100 becomes able to easily use delimiter characters consistent with the format of the compression target data 400 and may cause the same character strings to be likely to be gathered relatively close to one another in the second data 1000, thereby enabling an improvement in the compression efficiency to be achieved.

According to the information processing device 100, in a case where the number of the types of delimiter characters which occur in the compression target data 400 is greater than a threshold value, it is possible to divide the compression target data 400 into pieces of partial data, in each of which the number of the types of delimiter characters to occur becomes less than or equal to the threshold value. According to the information processing device 100, it is possible to generate the first data 800 obtained by arranging delimiter characters so as to allow an order in which the delimiter characters occur in a corresponding one of the pieces of partial data to be identified. According to the information processing device 100, it is possible to generate the second data 1000 obtained by arranging character strings for each of the types of combination of two delimiter characters so as to allow an order in which the character strings each sandwiched between two delimiter characters of the relevant type of combination occur in the corresponding one of the pieces of partial data to be identified. Thus, the information processing device 100 may suppress, for each of the types of combination of two delimiter characters, the size of a storage area used when classifying character strings each sandwiched between two delimiter characters of the relevant type of combination and may efficiently perform processing while cutting down the storage area.

According to the information processing device 100, it is possible to generate the first data 800 obtained by alternately arranging delimiter characters and predetermined characters in an order in which the delimiter characters occur in the compression target data 400. According to the information processing device 100, it is possible to generate the second data 1000 obtained by alternately arranging, for each of the types of combination of two delimiter characters, character strings each sandwiched between two delimiter characters of the relevant type of combination and predetermined characters in an order in which the character strings occur in the compression target data 400. Thus, even in a case where one of the delimiter characters includes two or more characters, the information processing device 100 may generate the first data 800 so as to allow a boundary between the delimiter characters to be identified. In addition, the information processing device 100 may generate the second data 1000 so as to allow a boundary between character strings to be identified.

According to the information processing device 100, it is possible to perform compression with the compression algorithm of the LZ77 or LZMA. Thus, the information processing device 100 may use the compression algorithm of the LZ77 or LZMA to be desirably used for compression of the second data 1000 and may achieve the reduction of the size of compressed data.

According to the information processing device 100, it is possible to cause the delimiter characters to include a character string including two or more characters. Thus, the information processing device 100 may cause the number of the types of delimiter characters to be easily increased and to cause the number of the types of combinations of two delimiter characters to be easily increased. Therefore, the information processing device 100 may cause character strings each sandwiched between two delimiter characters of the same type of combination to become character strings each having the same attribute and to cause the same character strings to be likely to be gathered relatively close to one another in the second data 1000, thereby enabling an improvement in the compression efficiency to be achieved.

According to the information processing device 100, under the assumption that each of the delimiter characters includes only one character, it is possible to exclude, from the delimiter characters, character strings having two or more characters. Thus, the information processing device 100 may cause the number of the types of delimiter characters to be difficult to be increased and to cause the number of the types of combinations of two delimiter characters to be difficult to be increased. Therefore, the information processing device 100 may suppress, for each of the types of combination of two delimiter characters, the size of a storage area used when classifying character strings each sandwiched between two delimiter characters of the relevant type of combination and may efficiently perform processing while cutting down the storage area. In addition, since the number of characters of each of the delimiter characters is fixed to one, the information processing device 100 does not need to clearly specify a boundary between the delimiter characters in the first data 800. Accordingly, it is possible to achieve the reduction of the size of the first data 800.

According to the information processing device 100, it is possible to cause the delimiter characters to include a control character. Thus, when classifying character strings for each of the types of combination of two delimiter characters, the information processing device 100 may classify character strings each sandwiched between two delimiter characters of a combination including the control character. As a result, the information processing device 100 may cause the same character strings to be likely to be gathered relatively close to one another in the second data 1000, thereby enabling an improvement in the compression efficiency to be achieved.

According to the information processing device 100, it is possible to handle under the assumption that a control character indicating a line feed occurs at the head of the compression target data 400, and accordingly, it is possible to generate the second data 1000. Thus, when classifying character strings for each of the types of combination of two delimiter characters, the information processing device 100 may classify a character string located at the head of the compression target data 400.

According to the information processing device 100, it is possible to decompress compressed data obtained by performing compression with the sliding dictionary method on the first data 800 and the second data 1000. According to the information processing device 100, it is possible to references the second data 1000 obtained by the decompression, thereby sequentially inserting, between two delimiter characters in the first data 800 obtained by the decompression, a character string associated with the type of the combination of the relevant two delimiter characters. Thus, the information processing device 100 may restore the original compression target data 400 from the compressed data which is efficiently compressed.

Note that a preliminarily prepared program may be executed by a computer such as a personal computer or a workstation, thereby enabling the compression method described in the present embodiment to be realized. The program may be recorded in a computer-readable recording medium such as a hard disk, a flexible disk, a compact disc ROM (CD-ROM), a magnetooptic disc (MO), or a digital versatile disc (DVD) and is read by the computer from the recording medium, thereby being executed. The compression program may be distributed via a network such as the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A non-transitory computer-readable recording medium having stored therein a program that causes a computer to execute a process, the process comprising:
    extracting delimiter characters and character strings from compression target data, the character strings each being sandwiched between two of the delimiter characters in the compression target data;
    obtaining first data of the delimiter characters arranged in an order that the delimiter characters occur in the compression target data to be identified;
    generating second data by re-arranging the character strings with each combination of beginning and ending delimiter characters grouped together;
    performing compression on the first data and the second data; and
    outputting a result of the compression.

2. The non-transitory computer-readable recording medium according to claim 1, the process further comprising: receiving designation of the delimiter characters.

3. The non-transitory computer-readable recording medium according to claim 1, the process further comprising:
    dividing, in a case where a number of types of the delimiter characters that occur in the compression target data is greater than a predetermined threshold value, the compression target data into pieces of partial data, in each of which a number of types of the delimiter characters to occur is less than or equal to the predetermined threshold value; and
    generating the first data and the second data for each of the pieces of partial data.

4. The non-transitory computer-readable recording medium according to claim 1, the process further comprising:
    generating the first data by alternately arranging the delimiter characters and predetermined characters in an order in which the delimiter characters occur in the compression target data; and
    generating the second data by alternately arranging, for each type of combination of two of the delimiter characters, the character strings and predetermined characters in an order in which the character strings occur in the compression target data.

5. The non-transitory computer-readable recording medium according to claim 1, wherein the compression is compression with a sliding dictionary method.

6. The non-transitory computer-readable recording medium according to claim 1, wherein the compression is compression with a compression algorithm of Lempel-Ziv 77 (LZ77) or Lempel-Ziv-Markov chain-Algorithm (LZMA).

7. The non-transitory computer-readable recording medium according to claim 1, wherein the delimiter characters include a character string including two or more characters.

8. The non-transitory computer-readable recording medium according to claim 1, wherein each of the delimiter characters includes only one character.

9. The non-transitory computer-readable recording medium according to claim 1, wherein the delimiter characters include a control character indicating control of the compression target data.

10. The non-transitory computer-readable recording medium according to claim 1, the process comprising: generating the second data while handling under an assumption that a control character indicating a line feed occurs at a head of the compression target data.

11. A data compression device, comprising:
    a memory; and
    a processor coupled to the memory and the processor configured to:
        extract delimiter characters and character strings from compression target data, the character strings each being sandwiched between two of the delimiter characters in the compression target data;
        obtain first data of the delimiter characters arranged in an order that the delimiter characters occur in the compression target data to be identified;
        generate second data by re-arranging the character strings with each combination of beginning and ending delimiter characters grouped together;
        perform compression on the first data and the second data; and
        output a result of the compression.

12. A non-transitory computer-readable recording medium having stored therein a program that causes a computer to execute a process, the process comprising:
    decompressing decompression target data into first data and second data, the first data having delimiter characters without decompressed character strings, the second data having the decompressed character strings without any of the delimiter characters;

generating restored original data by inserting each of the decompressed character strings between a pair of adjacent delimiter characters in the first data, based on a corresponding order of the first and second data; and
outputting the restored original data.

13. A data decompression device, comprising:

a memory; and a processor coupled to the memory and the processor configured to:
  decompress decompression target data into first data and second data, the first data having delimiter characters without decompressed character strings, the second data having the decompressed character strings without any of the delimiter characters;
  generate restored original data by inserting each of the decompressed character strings between a pair of adjacent delimiter characters in the first data, based on a corresponding order of the first and second data; and
  output the restored original data.

* * * * *